US012727221B2

(12) United States Patent
Chou

(10) Patent No.: US 12,727,221 B2
(45) Date of Patent: Sep. 1, 2026

(54) SEMICONDUCTOR DEVICE INCLUDING ALUMINUM CONCENTRATION THAT VARIES AS AN OSCILLATING FUNCTION AND METHOD FOR MANUFACTURING THE SAME

(71) Applicant: INNOSCIENCE (SUZHOU) SEMICONDUCTOR CO., LTD., Suzhou City (CN)

(72) Inventor: Yi-Lun Chou, Suzhou City (CN)

(73) Assignee: INNOSCIENCE (SUZHOU) SEMICONDUCTOR CO., LTD., Suzhou City (CN)

( * ) Notice: Subject to any disclaimer, the term of this patent is extended or adjusted under 35 U.S.C. 154(b) by 406 days.

(21) Appl. No.: 18/263,689

(22) PCT Filed: Apr. 12, 2022

(86) PCT No.: PCT/CN2022/086198

§ 371 (c)(1),
(2) Date: Jul. 31, 2023

(87) PCT Pub. No.: WO2022/218273

PCT Pub. Date: Oct. 20, 2022

(65) Prior Publication Data

US 2024/0105780 A1 Mar. 28, 2024

(30) Foreign Application Priority Data

Apr. 12, 2021 (WO) ................ PCT/CN2021/086526
Apr. 12, 2021 (WO) ................ PCT/CN2021/086528

(51) Int. Cl.

| | |
|---|---|
| ***H10D 62/85*** | (2025.01) |
| ***H10D 30/01*** | (2025.01) |
| ***H10D 30/47*** | (2025.01) |

(52) U.S. Cl.
CPC ....... *H10D 62/8503* (2025.01); *H10D 30/015* (2025.01); *H10D 30/475* (2025.01)

(58) Field of Classification Search
CPC ............. H10D 62/8503; H10D 30/015; H10D 30/475; H10D 62/343; H10D 62/357; H01L 21/02458; H01L 21/02507; H01L 21/0254
See application file for complete search history.

(56) References Cited

U.S. PATENT DOCUMENTS

| | | | |
|---|---|---|---|
| 5,604,356 | A | 2/1997 | Shiraishi |
| 8,536,615 | B1 | 9/2013 | Driscoll et al. |

(Continued)

FOREIGN PATENT DOCUMENTS

| | | | |
|---|---|---|---|
| CN | 103367421 | A | 10/2013 |
| CN | 103403840 | A | 11/2013 |

(Continued)

OTHER PUBLICATIONS

ISA State Intellectual Property Office of the People's Republic of China, International Search Report Issued in Application No. PCT/CN2021/086528, Jan. 14, 2022, WIPO, 2 pages.

(Continued)

*Primary Examiner* — William B Partridge
*Assistant Examiner* — David Paul Sedorook
(74) *Attorney, Agent, or Firm* — McCoy Russell LLP

(57) ABSTRACT

A semiconductor device includes a nucleation layer, a buffer layer, a first nitride-based semiconductor layer, a second nitride-based semiconductor layer, S/D electrodes, and a gate electrode. The nucleation layer includes a composition that includes a first element. The buffer layer includes a III-V compound which includes the first element. The buffer layer is disposed on and forms an interface with the nucleation layer. The buffer layer has a concentration of the first (Continued)

element oscillating within the buffer layer, such that the concentration of the first element varies as an oscillating function of a distance within a thickness of the buffer layer. Spacings among adjacent peaks of the oscillating function change from wide to narrow with respect to a first reference point within the buffer layer. The first and second nitride-based semiconductor layer, S/D electrodes, and a gate electrode are disposed on the buffer layer.

18 Claims, 14 Drawing Sheets

(56) References Cited

U.S. PATENT DOCUMENTS 8,963,164 B2 2/2015 Shmizu et al.
9,276,066 B2 3/2016 Tamura et al.
9,496,349 B2 11/2016 Lutgen et al.
9,508,822 B2 11/2016 Oka et al.
9,608,075 B1 3/2017 Wan et al.
9,653,589 B2 5/2017 Umeno et al.
9,786,744 B2 10/2017 Lutgen et al.
9,923,061 B2 3/2018 Bavard et al.
10,026,814 B2 7/2018 Lutgen et al.
10,186,421 B2 1/2019 Fukazawa et al.
10,211,296 B2 2/2019 Lutgen et al.
10,332,876 B2 6/2019 Siemieniec et al.
10,720,520 B2 7/2020 Park et al.
11,581,269 B2 2/2023 Park et al.
11,869,942 B2 1/2024 Thapa et al.
2002/0096692 A1 7/2002 Nakamura et al.
2005/0110043 A1 5/2005 Otsuka et al.
2010/0244096 A1* 9/2010 Sato .................. H01L 21/02458 257/190
2011/0272665 A1 11/2011 Yamaguchi et al.
2011/0297961 A1 12/2011 Bunin et al.
2013/0307023 A1 11/2013 Kokawa et al.
2014/0061665 A1 3/2014 Tsuchiya
2014/0091318 A1 4/2014 Ishiguro et al.
2015/0076449 A1 3/2015 Yamada
2015/0357419 A1 12/2015 Lutgen et al.
2015/0372124 A1 12/2015 Isobe et al.
2016/0072386 A1 3/2016 Saito
2017/0033210 A1 2/2017 Curatola et al.
2017/0077242 A1 3/2017 Lutgen et al.
2017/0373156 A1 12/2017 Lutgen et al.
2018/0097072 A1 4/2018 Briere
2018/0323265 A1 11/2018 Liu et al.
2018/0331187 A1 11/2018 Lutgen et al.
2018/0374941 A1 12/2018 Park et al.
2019/0221648 A1* 7/2019 Liu ..................... H10D 62/824
2019/0348411 A1 11/2019 Chen et al.
2020/0303531 A1 9/2020 Park et al.
2021/0126118 A1 4/2021 Baines et al.
2021/0151591 A1* 5/2021 Chen .................. H10D 30/4755
2021/0257214 A1 8/2021 Cheng et al.
2022/0328672 A1 10/2022 Chou et al.
2022/0328675 A1 10/2022 Chou et al.
2022/0328677 A1 10/2022 Chou et al.
2022/0328678 A1 10/2022 Chou et al.
2023/0072850 A1 3/2023 Chou et al.
2023/0290873 A1 9/2023 Lin et al.

FOREIGN PATENT DOCUMENTS

CN 104465743 A 3/2015
CN 105229207 A 1/2016
CN 107464841 A 12/2017
CN 107710417 A 2/2018
CN 109103099 A 12/2018
CN 111490100 A 8/2020
JP 2011023642 A 2/2011
JP 2015035535 A 2/2015
WO 2010044978 A1 4/2010
WO 2020155096 A1 8/2020

OTHER PUBLICATIONS

ISA State Intellectual Property Office of the People's Republic of China, Written Opinion of the International Searching Authority Issued in Application No. PCT/CN2021/086528, Jan. 14, 2022, WIPO, 4 pages.
ISA State Intellectual Property Office of the People's Republic of China, International Search Report Issued in Application No. PCT/CN2021/086526, Jan. 17, 2022, WIPO, 2 pages.
ISA State Intellectual Property Office of the People's Republic of China, Written Opinion of the International Searching Authority Issued in Application No. PCT/CN2021/086526, Jan. 17, 2022, WIPO, 4 pages.
ISA State Intellectual Property Office of the People's Republic of China, International Search Report Issued in Application No. PCT/CN2022/086198, Jul. 7, 2022, WIPO, 2 pages.
ISA State Intellectual Property Office of the People's Republic of China, Written Opinion of the International Searching Authority Issued in Application No. PCT/CN2022/086198, Jul. 7, 2022, WIPO, 4 pages.
State Intellectual Property Office of the People's Republic of China, Office Action and Search Report Issued in Application No. 202180005980.2, Nov. 30, 2022, 23 pages. (Submitted with Machine/Partial Translation).
United States Patent and Trademark Office, Office Action Issued in U.S. Appl. No. 17/384,832, Requirement for Restriction, Jun. 15, 2023, 8 pages.
United States Patent and Trademark Office, Office Action Issued in U.S. Appl. No. 17/384,837, Non-Final Rejection Jul. 13, 2023, 27 pages.
United States Patent and Trademark Office, Non-Final Office Action Issued in U.S. Appl. No. 17/384,832, Sep. 6, 2023, 21 pages.
United States Patent and Trademark Office, Non-Final Office Action Issued in U.S. Appl. No. 17/384,839, Oct. 16, 2023, 20 pages.
United States Patent and Trademark Office, Non-Final Office Action Issued in U.S. Appl. No. 17/420,717, Oct. 30, 2023, 28 pages.
United States Patent and Trademark Office, Non-Final Office Action Issued in U.S. Appl. No. 17/384,831, Nov. 16, 2023, 24 pages.
United States Patent and Trademark Office, Non-Final Office Action Issued in U.S. Appl. No. 17/384,833, Nov. 16, 2023, 23 pages.
United States Patent and Trademark Office, Final Office Action Issued in U.S. Appl. No. 17/384,835, Mar. 18, 2024, 17 pages.
United States Patent and Trademark Office, Final Office Action Issued in U.S. Appl. No. 17/384,838, Mar. 18, 2024, 17 pages.
United States Patent and Trademark Office, Non-Final Office Action Issued in U.S. Appl. No. 17/380,044, Mar. 28, 2024, 31 pages.
United States Patent and Trademark Office, Final Office Action Issued in U.S. Appl. No. 17/384,839, Apr. 2, 2024, 21 pages.
United States Patent and Trademark Office, Final Office Action Issued in U.S. Appl. No. 17/384,833, Apr. 18, 2024, 19 pages.
United States Patent and Trademark Office, Advisory Action Issued in U.S. Appl. No. 17/384,831, Apr. 19, 2024, 6 pages.
United States Patent and Trademark Office, Advisory Action Issued in U.S. Appl. No. 17/420,717, Apr. 22, 2024, 5 pages.
United States Patent and Trademark Office, Advisory Action Issued in U.S. Appl. No. 17/384,837, Apr. 23, 2024, 10 pages.
United States Patent and Trademark Office, Advisory Action Issued in U.S. Appl. No. 17/384,838, May 24, 2024, 6 pages.
United States Patent and Trademark Office, Advisory Action Issued in U.S. Appl. No. 17/384,835, May 28, 2024, 5 pages.
United States Patent and Trademark Office, Non-Final Office Action issued in U.S. Appl. No. 17/420,717, Jun. 4, 2024, 17 pages.
United States Patent and Trademark Office, Non-Final Office Action Issued in U.S. Appl. No. 17/384,831, Jun. 4, 2024, 17 pages.
United States Patent and Trademark Office, Non-Final Office Action Issued in U.S. Appl. No. 17/380,040, Jun. 11, 2024, 33 pages.
United States Patent and Trademark Office, Non-Final Office Action Issued in U.S. Appl. No. 17/380,041, Jun. 11, 2024, 33 pages.

(56) References Cited

OTHER PUBLICATIONS

United States Patent and Trademark Office, Non-Final Office Action Issued in U.S. Appl. No. 17/380,043, Jun. 20, 2024, 35 pages.
United States Patent and Trademark Office, Advisory Action Issued in U.S. Appl. No. 17/384,833, Jul. 17, 2024, 5 pages.
United States Patent and Trademark Office, Non-Final Office Action Issued in U.S. Appl. No. 17/384,835, Dec. 8, 2023, 27 pages.
United States Patent and Trademark Office, Non-Final Office Action Issued in U.S. Appl. No. 17/384,838, Dec. 11, 2023, 27 pages.
United States Patent and Trademark Office, Non-Final Office Action Issued in U.S. Appl. No. 17/420,718, Jan. 3, 2024, 31 pages.
United States Patent and Trademark Office, Final Office Action Issued in U.S. Appl. No. 17/384,837, Jan. 9, 2024, 20 pages.
United States Patent and Trademark Office, Requirement Restriction Issued in U.S. Appl. No. 17/380,044, Jan. 22, 2024, 6 pages.
United States Patent and Trademark Office, Final Office Action Issued in U.S. Appl. No. 17/420,717, Feb. 9, 2024, 18 pages.
United States Patent and Trademark Office, Final Office Action Issued in U.S. Appl. No. 17/384,831, Feb. 14, 2024, 21 pages.
State Intellectual Property Office of the People's Republic of China, Office Action and Search Report Issued in Application No. 202180094894.3, May 12, 2026, 35 pages. (Submitted with English Translation).

* cited by examiner 68
66
64
62
60
62

SEMICONDUCTOR DEVICE INCLUDING ALUMINUM CONCENTRATION THAT VARIES AS AN OSCILLATING FUNCTION AND METHOD FOR MANUFACTURING THE SAME

CROSS REFERENCE TO RELATED APPLICATIONS

The present application is a U.S. National Stage of International Application No. PCT/CN2022/086198 filed on Apr. 12, 2022, which claims priority to the International Applications PCT/CN2021/086526 filed on Apr. 12, 2021 and PCT/CN2021/086528 filed on Apr. 12, 2021. The contents of the related applications are incorporated herein by reference in their entireties for all purposes.

FIELD OF THE INVENTION

The present invention generally relates to a semiconductor device. More specifically, the present invention relates to a high electron mobility transistor (HEMT) semiconductor device having a buffer layer with an oscillatory concentration of group III element to modulate the resistivity.

BACKGROUND OF THE INVENTION

In recent years, intense research on high-electron-mobility transistors (HEMTs) has been prevalent for semiconductor devices, such as high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HEMT devices, thereby making them suitable for mass production.

SUMMARY OF THE INVENTION

In accordance with one aspect of the present disclosure, a semiconductor device includes a substrate, a nucleation layer, a buffer layer, a first nitride-based semiconductor layer, a second nitride-based semiconductor layer, two or more source/drain (S/D) electrodes. The nucleation layer includes a composition that includes a first element and disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. The oscillating function has a first crest, a second crest, and a third crest in sequence. The second crest is higher than the first crest and is lower than the third crest, and a horizontal distance between the first and second crests is substantial the same as a horizontal distance between the second and third crests. The first nitride-based semiconductor layer is disposed on and forming an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a two-dimensional electron gas (2DEG) region. The S/D electrodes and a gate electrode are disposed over the second nitride-based semiconductor layer. The gate electrode is between the S/D electrodes.

In accordance with one aspect of the present disclosure, a method for manufacturing a semiconductor device is provided. The method includes steps as follows. A nucleation layer including a composition that comprises a first element is formed. A buffer layer is formed on the nucleation layer. The buffer layer includes a III-V compound which includes the first element. The buffer layer has a concentration of the first element oscillating within the buffer layer, such that the concentration of the first element varies as an oscillating function of a distance within a thickness of the buffer layer. The oscillating function has a first crest, a second crest, and a third crest in sequence. The second crest is higher than the first crest and is lower than the third crest, and a horizontal distance between the first and second crests is substantial the same as a horizontal distance between the second and third crests. A first nitride-based semiconductor layer is formed on the buffer layer. A second nitride-based semiconductor layer is formed on the second nitride-based semiconductor layer. The second nitride-based semiconductor layer has a bandgap greater than a bandgap of the first nitride-based semiconductor layer, so as to form a heterojunction therebetween with a 2DEG region. Two or more S/D electrodes and a gate electrode are formed over the second nitride-based semiconductor layer.

In accordance with one aspect of the present disclosure, a semiconductor device includes a substrate, a nucleation layer, a buffer layer, a first nitride-based semiconductor layer, a second nitride-based semiconductor layer, two or more S/D electrodes. The nucleation layer includes a composition that includes a first element and disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. The oscillating function has a first crest, a second crest, and a third crest in sequence. The second crest is higher than the first crest and is lower than the third crest, and a horizontal distance between the first and second crests differs from a horizontal distance between the second and third crests. The first nitride-based semiconductor layer is disposed on and forming an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and a gate electrode are disposed over the second nitride-based semiconductor layer. The gate electrode is between the S/D electrodes.

In accordance with one aspect of the present disclosure, a method for manufacturing a semiconductor device is provided. The method includes steps as follows. A nucleation layer including a composition that comprises a first element is formed. A buffer layer is formed on the nucleation layer. The buffer layer includes a III-V compound which includes the first element. The buffer layer has a concentration of the first element oscillating within the buffer layer, such that the concentration of the first element varies as an oscillating function of a distance within a thickness of the buffer layer.

The oscillating function has a first crest, a second crest, and a third crest in sequence. The second crest is higher than the first crest and is lower than the third crest, and a horizontal distance between the first and second crests differs from a horizontal distance between the second and third crests. A first nitride-based semiconductor layer is formed on the buffer layer. A second nitride-based semiconductor layer is formed on the second nitride-based semiconductor layer. The second nitride-based semiconductor layer has a bandgap greater than a bandgap of the first nitride-based semiconductor layer, so as to form a heterojunction therebetween with a 2DEG region. Two or more S/D electrodes and a gate electrode are formed over the second nitride-based semiconductor layer.

In accordance with one aspect of the present disclosure, a semiconductor device includes a substrate, a nucleation layer, a buffer layer, a first nitride-based semiconductor layer, a second nitride-based semiconductor layer, two or more S/D electrodes. The nucleation layer includes a composition that includes a first element and disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. The oscillating function has a first crest, a first trough, a second crest, and a second trough in sequence, the first trough is higher than the second trough, and a height difference between the first and second crests is less than a height difference between the first and second troughs. The first nitride-based semiconductor layer is disposed on and forming an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and a gate electrode are disposed over the second nitride-based semiconductor layer. The gate electrode is between the S/D electrodes.

In accordance with one aspect of the present disclosure, a method for manufacturing a semiconductor device is provided. The method includes steps as follows. A nucleation layer including a composition that comprises a first element is formed. A buffer layer is formed on the nucleation layer. The buffer layer includes a III-V compound which includes the first element. The buffer layer has a concentration of the first element oscillating within the buffer layer, such that the concentration of the first element varies as an oscillating function of a distance within a thickness of the buffer layer. The oscillating function has a first crest, a first trough, a second crest, and a second trough in sequence, the first trough is higher than the second trough, and a height difference between the first and second crests is less than a height difference between the first and second troughs. A first nitride-based semiconductor layer is formed on the buffer layer. A second nitride-based semiconductor layer is formed on the second nitride-based semiconductor layer. The second nitride-based semiconductor layer has a bandgap greater than a bandgap of the first nitride-based semiconductor layer, so as to form a heterojunction therebetween with a 2DEG region. Two or more S/D electrodes and a gate electrode are formed over the second nitride-based semiconductor layer.

In accordance with one aspect of the present disclosure, a semiconductor device includes a substrate, a nucleation layer, a buffer layer, a first nitride-based semiconductor layer, a second nitride-based semiconductor layer, two or more S/D electrodes. The nucleation layer includes a composition that includes a first element and disposed on and forming an interface with the substrate. The buffer layer includes a III-V compound which includes the first element. The buffer layer is disposed on and forms an interface with the nucleation layer. The buffer layer has a concentration of the first element oscillating within the buffer layer, such that the concentration of the first element varies as an oscillating function of a distance within a thickness of the buffer layer. The oscillating function has a first crest, a first trough, a second crest, and a second trough in sequence. The second crest is higher than first crest, the second trough is lower than first trough such that the oscillating function has an increasing amplitude. The first nitride-based semiconductor layer is disposed on and forming an interface with the buffer layer. The second nitride-based semiconductor layer is disposed on the first nitride-based semiconductor layer and has a bandgap greater than a bandgap of the first nitride-based semiconductor layer, so as to form a heterojunction therebetween with a 2DEG region. The S/D electrodes and a gate electrode are disposed over the second nitride-based semiconductor layer. The gate electrode is between the S/D electrodes.

In accordance with one aspect of the present disclosure, a method for manufacturing a semiconductor device is provided. The method includes steps as follows. A nucleation layer including a composition that comprises a first element is formed. A buffer layer is formed on the nucleation layer. The buffer layer includes a III-V compound which includes the first element. The buffer layer has a concentration of the first element oscillating within the buffer layer, such that the concentration of the first element varies as an oscillating function of a distance within a thickness of the buffer layer. The oscillating function has a first crest, a first trough, a second crest, and a second trough in sequence. The second crest is higher than first crest, the second trough is lower than first trough such that the oscillating function has an increasing amplitude. A first nitride-based semiconductor layer is formed on the buffer layer. A second nitride-based semiconductor layer is formed on the second nitride-based semiconductor layer. The second nitride-based semiconductor layer has a bandgap greater than a bandgap of the first nitride-based semiconductor layer, so as to form a heterojunction therebetween with a 2DEG region. Two or more S/D electrodes and a gate electrode are formed over the second nitride-based semiconductor layer.

By applying the above configuration, the variable concentration of aluminum has the decremental decreases and the incremental increases, such that the trend of the variable concentration of aluminum can reverse, which turns the trend of the curvature of the buffer layer. The curvature can be avoided to become very positive or negative. Moreover, the oscillation rate can be adjusted such that the formation of the buffer layer can comply with the layer design, such as requirements for modulation to the resistivity.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
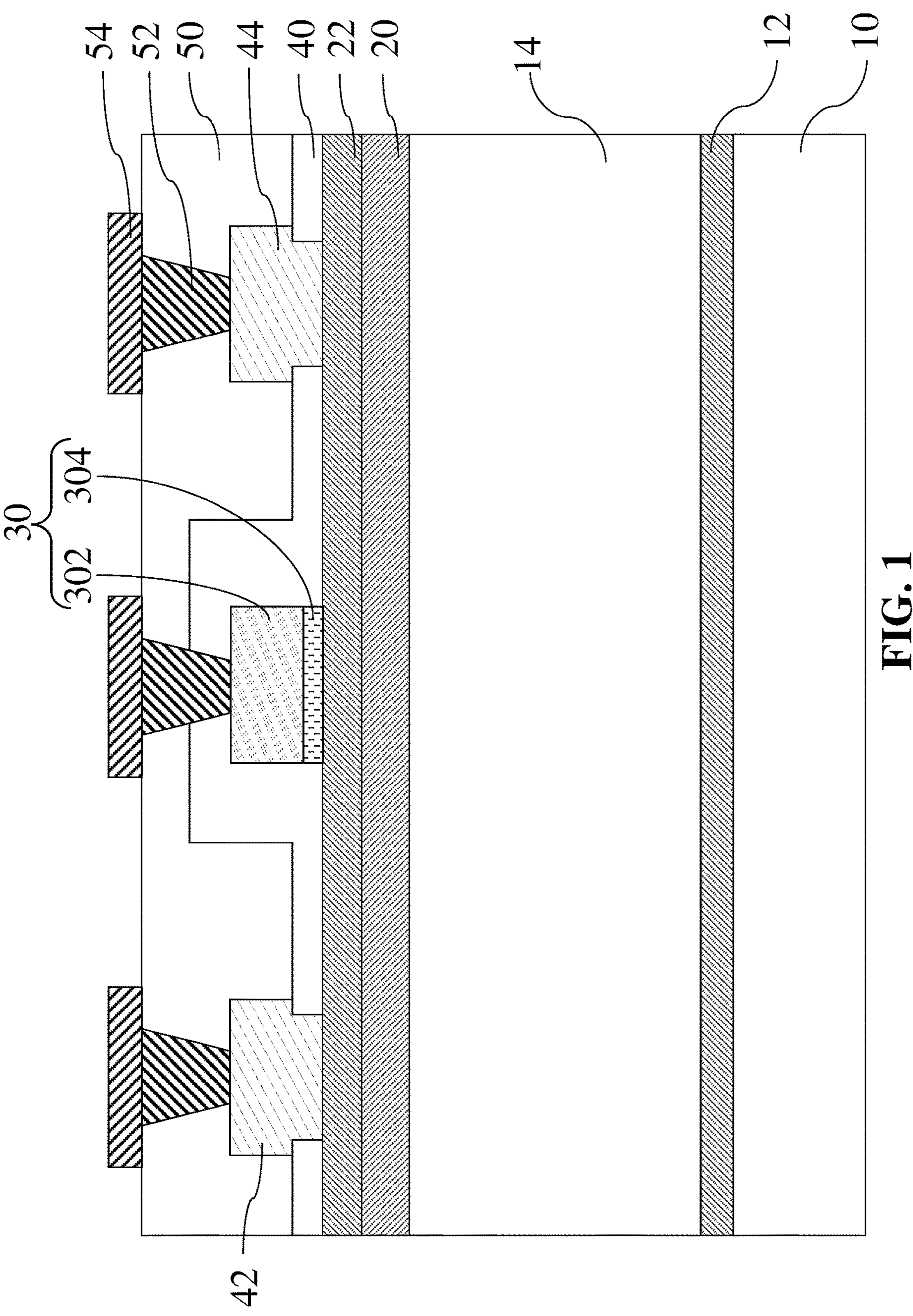
FIG. 1 is a cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor devices/semiconductor die, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a cross-sectional view of a semiconductor device 1A according to some embodiments of the present disclosure. The semiconductor device 1A includes a substrate 10, a nucleation layer 12, a buffer layer 14, nitride-based semiconductor layers 20 and 22, a gate structure 30, a passivation layer 40, a pair of source/drain (S/D) electrodes 42 and 44, a passivation layer 40, contact vias 52, and a patterned conductive layer 54.

The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example but are not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxy (epi) layer, or combinations thereof.

The nucleation layer 12 is formed on the substrate 10. The nucleation layer 12 may form an interface with the substrate 10. The nucleation layer 12 is configured to provide a top surface for growth of III-nitride material thereon. In other words, the nucleation layer 12 forms an appropriate template to transition from lattice of the substrate to a template more suitable for growth of III-nitride material. The nucleation layer 12 can provide a transition to accommodate a mismatch/difference between the substrate 10 and a III-nitride layer to be formed on the top surface thereof (e.g., epitaxially formation). The mismatch/difference may refer to different lattice constants or thermal expansion coefficients. The mismatch/difference might cause dislocation in the formed layer and thus the yield rate is reduced. The exemplary material of the nucleation layer 12 can include, for example but is not limited to AlN or any of its alloys. The AlN may be, for example, but is not limited to doped n-type, p-type, or intrinsic. The material(s) of the nucleation layer can be selected to cur the mismatch/difference. For example, in order to accommodate a mismatch/difference due to a first element in a layer to be formed on the nucleation layer, the nucleation layer 12 is formed with including the first element.

The buffer layer 14 is formed on the nucleation layer 12. The buffer layer 14 may form an interface with the nucleation layer 12. The buffer layer 14 has a bottom-most surface in contact with the nucleation layer 12. The interface is formed by the bottom-most surface of the buffer layer 14 and a top-most surface of the nucleation layer 12. The buffer layer 14 has a top-most surface opposite the bottom-most surface. The buffer layer 14 is configured to reduce lattice and thermal mismatches between the underlying layer and a layer to be formed on the buffer layer 14 (e.g., epitaxially formed thereon), thereby curing defects due to the mismatches/difference.

The buffer layer 14 includes a III-V compound. The III-V compound can include, for example but are not limited to, aluminum, gallium, indium, nitride, or combinations thereof. Accordingly, the exemplary materials of the buffer layer 14 can further include, for example but are not limited to, AlN, AlGaN, InAlGaN, or combinations thereof. In some embodiments, the buffer layer 14 may include two kinds of group III elements, and the nucleation layer only has one kind of the group III elements. For example, the nucleation layer includes a compound which includes aluminum and is devoid of gallium (e.g., AlN), and the buffer layer 14 includes a III-V compound which includes aluminum and gallium (e.g., AlGaN).

The nitride-based semiconductor layer 20 is disposed over the buffer layer 14. The exemplary materials of the nitride-based semiconductor layer 20 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The nitride-based semiconductor layer 22 is disposed on the nitride-based semiconductor layer 20. The exemplary materials of the nitride-based semiconductor layer 22 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 20 and 22 are selected such that the nitride-based semiconductor layer 22 has a bandgap (i.e. forbidden band width) greater than a bandgap of the nitride-based semiconductor layer 20, which causes electron affinities thereof different from each other and forms a heterojunction therebetween. For example, when the nitride-based semiconductor layer 20 is an undoped GaN layer having bandgap of approximately 3.4 eV, the nitride-based semiconductor layer 22 may be an AlGaN layer having bandgap of approximately 4.0 eV. As such, the nitride-based semiconductor layers 20 and 22 serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the semiconductor device 1A can include at least one GaN-based high-electron-mobility transistor (HEMT).

In a case that the nitride-based semiconductor layer 20 is devoid of aluminum, the buffer layer 14 including aluminum gallium nitride (AlGaN) is formed to reduce lattice and thermal mismatches between the underlying layer (e.g., the substrate 10) and the nitride-based semiconductor layer 20. For the purpose of reducing lattice and thermal mismatches, as the nitride-based semiconductor layer 20 includes gallium nitride (GaN) and the nitride-based semiconductor layer 22 includes aluminum gallium nitride (AlGaN), the nucleation layer 12 and the buffer layer can be selected to include aluminum nitride (AlN) and aluminum gallium nitride (AlGaN), respectively. To illustrate, the buffer layer 14 of the present embodiment includes aluminum gallium nitride (AlGaN), and it is for the exemplary purpose and the present disclosure is not limited thereto.

In such the configuration, the buffer layer 14 can be formed to cure defects as stated above and further modulate the resistivity between the nucleation layer 12 and the nitride-based semiconductor layer 20. For example, the aluminum content in the buffer layer 14 may be correlated with the resistivity thereof. In some embodiments, the buffer layer 14 may have a resistivity that is positive correlation with the concentration of the group III element. In some embodiments, the buffer layer 14 may have a resistivity that is positive correlation with the concentration of the aluminum.

Although a buffer layer can be formed for purposes as stated above, over-accumulated stresses during the growth of a buffer layer may affect a layer to be formed on the buffer layer. Over-accumulated stresses will affect a yield rate of a semiconductor device.

In this regard, the buffer layer 14 can have a variable concentration of a group III element to solve such issues. One of the reasons to design the concentration of the group III element as being variable is to prevent the buffer layer 14 or a layer formed on the buffer layer 14 (e.g., the nitride-based semiconductor layer 20) from bending due to over-accumulated stress. For example, as the buffer layer 14 includes AlGaN, the buffer layer 14 may have a variable concentration of aluminum. Herein, the variable concentration may refer to include both an increasing trend and a decreasing trend in the concentration. The variable concentration may increase and then decrease. The variable concentration may decrease and then increase. The increase may include an incremental increase. The decrease may include a decremental decrease. The incremental increase and decremental decrease can result in oscillation in the concentration of aluminum. In some embodiments, the oscillation rate is adjustable and controllable, so as to fit the desire thickness of the buffer layer 14.

Figures 2A, 2B:
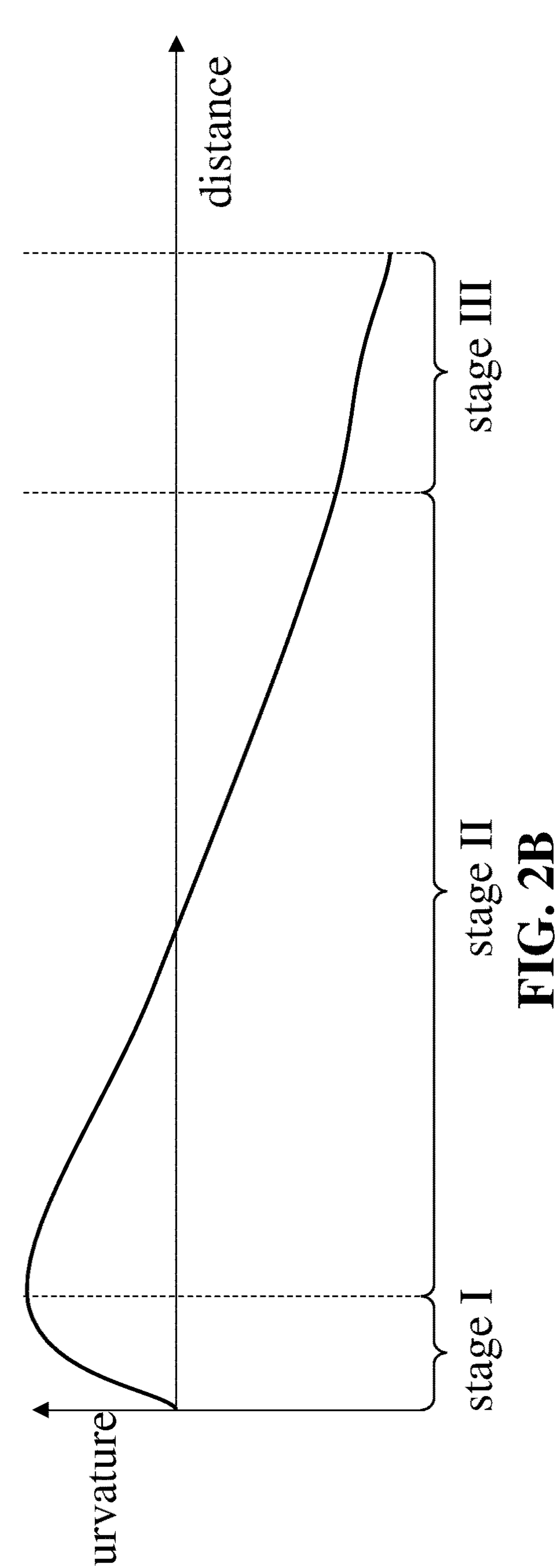
FIG. 2A is a cross-section view schematically showing a manufacturing stage for a semiconductor device according to a comparative embodiment.
FIG. 2B is a graph showing curvature versus a distance within a thickness of a buffer layer of the semiconductor device of FIG. 2A.

To demonstrate how a concentration can affect a yield rate, FIG. 2A is a cross-section view schematically showing a manufacturing stage for a semiconductor device 2 according to a comparative embodiment, and FIG. 2B is a graph showing curvature versus a distance within a thickness of a buffer layer of the semiconductor device 10 of FIG. 2A. As shown in FIG. 2A, an nucleation layer 62, a buffer layer 64, and nitride-based semiconductor layers 66 and 68 are formed on a substrate 60 in sequence. In the comparative embodiment, the nucleation layer 62 is made of aluminum nitride (AlN), the buffer layer 64 is made of aluminum gallium nitride (AlGaN), the nitride-based semiconductor layer 66 is made of gallium nitride (GaN), and the nitride-based semiconductor layer 68 is made of aluminum gallium nitride (AlGaN).

The distance of FIG. 2B can refer to a distance from a top surface of the substrate 60. As shown in FIG. 2B, there are three stages I, II, and III, in which the stage I is the formation of the nucleation layer 62; the stage II is the formation of the buffer layer 64; and the stage III is the formation of the nitride-based semiconductor layer 66.

In the stage I, with the growth of the nucleation layer 62, the curvature increases due to accumulation of stress during the formation. In the stage II, the buffer layer 64 is formed for curing the aforementioned mismatches/difference. Accordingly, an aluminum concentration of the buffer layer 64 gradually decreases without increase as the growth of buffer layer 64 goes. The gradual decrease of the aluminum concentration is made for matching the properties of the nitride-based semiconductor layer 66 to be formed thereon. It is found that the trend of the aluminum concentration correlates with that of the curvature. That is, as the aluminum concentration continuously decreases, the curvature goes to the single direction. Accordingly, at the end of the formation of the buffer layer 64, the degree of the curvature is large (e.g., very positive curvature or very negative curvature). Thereafter, in the stage III, as growth of the nitride-based semiconductor layer 66, the curvature continuously develops along the single direction.

Eventually, such degree of the curvature will result in warpage in the formed layer. For example, once the warpage occurs at the nitride-based semiconductor layer 66, cracks or voids 62 may appear in the same, which reduces quality of the nitride-based semiconductor layer 66 and reduces the yield rate of the final product as well. Therefore, the curvature issue resulted from the growth of the buffer layer exists in the manufacturing process. In the exemplary illustration of FIG. 2A, the cracks or voids 62 can result from lattice mismatch or coefficient of thermal expansion (CTE) mismatch. For the lattice mismatch, the cracks or voids 62 may start from an interface between two layers (e.g., being from an interface between the substrate 60 and the nucleation layer 62). For the CTE mismatch, the cracks or voids 62 may appear at any position within an epitaxy layer, such as the buffer layer 64, the nitride-based semiconductor layer 66 or 68. However, the appearance location of the cracks or voids 62 depends on the process condition in the practical situations.

Briefly, once the aluminum concentration increases or decreases in a fixed trend, the stress is accumulated continuously so the curvature would get greater. The variable concentration of the group III element in the buffer layer 14 of FIG. 1 can reduce the curvature in the buffer layer 14 during the formation thereof, so as to avoid the nitride-based semiconductor layers 20 and 22 having cracks or voids.

Figure 3:
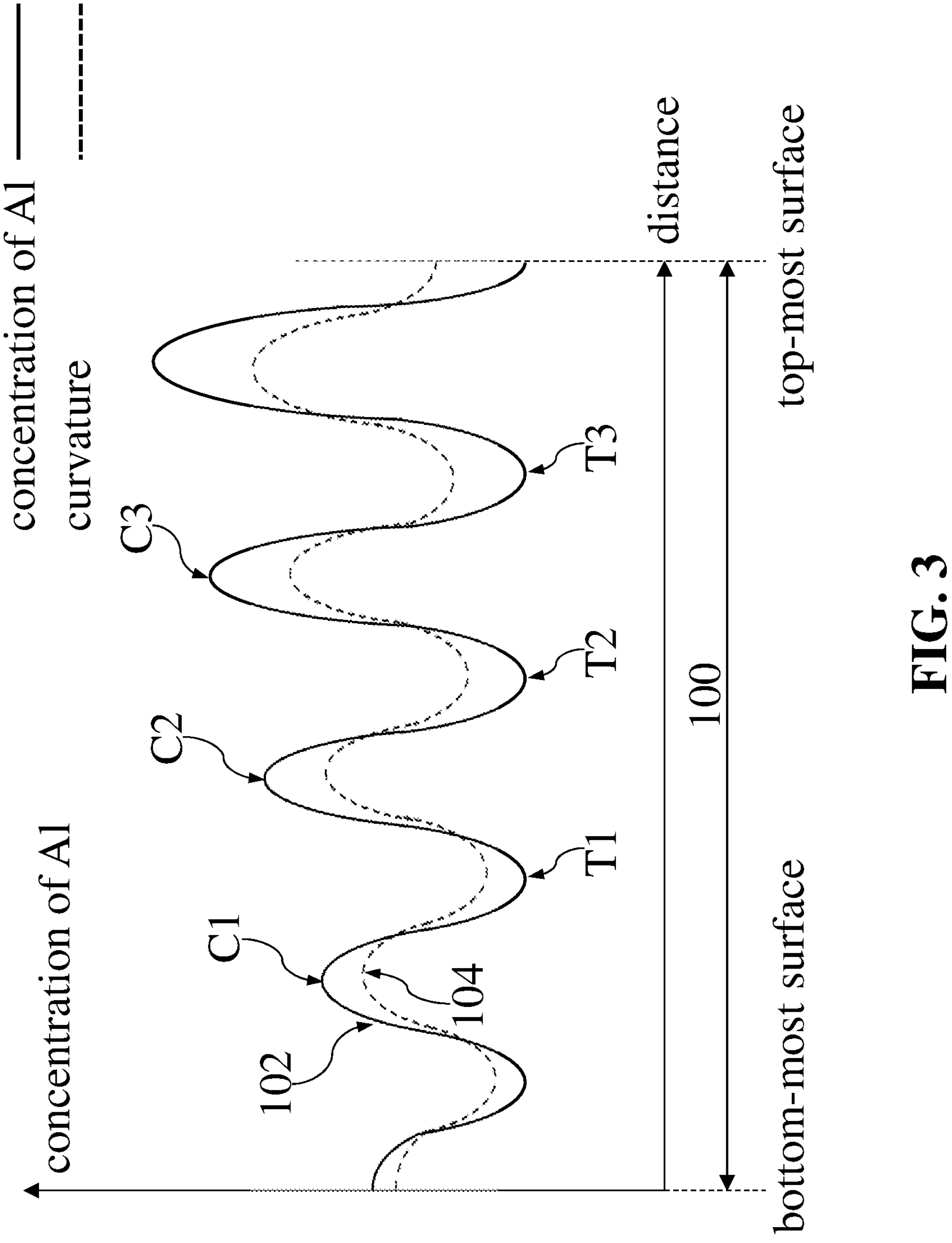
FIG. 3 is a graph showing a variable concentration of aluminum in a buffer layer versus a distance within a thickness of the same according to some embodiments of the present disclosure.

The reason to avoid a nitride-based semiconductor having cracks or voids by a buffer layer having a variable concentration of a group III element can be explained on FIG. 3, which is a graph showing a variable concentration of aluminum in a buffer layer 100 versus a distance within a thickness of the same according to some embodiments of the present disclosure.

In FIG. 3, a bottom-most surface and a top-most surface of the buffer layer 100 are labeled on the corresponding locations at the X-axis for convenient reference. The distance at the X-axis can refer to a distance from the bottom-most surface to the top-most surface of the buffer layer 100, and is in an arbitrary unit. The Y-axis represents the value of the concentration of aluminum in the buffer layer 100, where the unit is "%."

The graph of FIG. 3 reflects a relationship curve 102 for the variable concentration of aluminum. As shown in FIG. 3, the term "variable concentration of aluminum" can be defined as that the concentration of aluminum varies as an oscillating function of a distance within a thickness of the buffer layer 100.

Regarding "the oscillating function", the buffer layer can include at least one incremental increase and at least one decremental decrease in the variable concentration of aluminum. In the exemplary illustration of FIG. 3, from the bottom-most surface toward the top-most surface of the buffer layer 100, the variable concentration of aluminum decrementally decreases, incrementally increases, decrementally decreases, and incrementally increases in sequence.

Since there are more than one incremental increase and more than one decremental decrease, the relationship curve 102 representing the variable concentration of aluminum in the buffer layer 100 can have at least one part cyclically oscillating. This is, the measurement to the buffer layer 100 may show the variable concentration of aluminum has a cyclical oscillation feature. Herein, the term "cyclical oscillation" can mean the concentration of aluminum varies by alternatively increasing and decreasing in a range.

The cyclical oscillation may include a regular variation or an irregular variation, which may be composed by at least one wave function. In some embodiments, the wave function is an oscillating function with a continuous curve. In some embodiments, the wave function can include at least one, for example but are not limited to, sinusoid curve, sine wave, cosine wave, triangle wave, sawtooth wave, saw wave, step wave, and combinations thereof. In some embodiments, the relationship curve 102 can be an oscillating curve/a cyclical curve changing periodically (i.e., a periodic curve).

As afore-mentioned, the trend of the curvature depends on whether the variable concentration increases or decreases. With the concentration of aluminum varying as "decrementally decreasing and then incrementally increasing" and "incrementally increasing and then decrementally decreasing", the curvature would be in variation correspondingly.

The graph of FIG. 3 reflects a relationship curve 104 for the curvature of the buffer layer 30. It should be noted that the curvature shown in FIG. 3 is exemplary and schematically reflects the trend of the curvature, and the absolute intensity may be varied due to the differences in the practical conditions (e.g., process conditions, measurement condition, or detection conditions). In some embodiments, the trend may turn at a time point as being earlier or later than the graph of FIG. 3. For example, once formation recipes are varied, the relationship curve 104 may have the wave profile changed but the curvature trend is still similar with that as shown in FIG. 3.

Because the buffer layer 100 having the variable concentration of aluminum is formed, the variable concentration of aluminum can push the curvature in variation. More specifically, at the beginning of the growth of the buffer layer 100, since the concentration of aluminum decrementally decreases, the curvature changes as being in a negative trend. That is, the curvature may go from a positive state to a negative state. It may occur due to change of bending. Then, the concentration of aluminum is turned to incrementally increase, such that the trend of the curvature is turned as being positive. Such turning can make the curvature reduced. That is, with turning the trend of the curvature, it avoids that the negative curvature further becomes very negative. As the curvature is reduced, a layer to be formed on the buffer layer 100 (e.g., a nitride-based semiconductor layer) can have quality improved. It means the curvature can be controllable in a desired range. Herein, the desired range may refer to as being neither very positive nor very negative.

Along the cyclical oscillation, the aluminum concentration will gradually increase. With the gradually increasing, the resistivity of the buffer layer 100 can be modulated to get greater. As compared with direct increase in an aluminum concentration, the variation in the aluminum concentration as shown in FIG. 3 can avoid the trend of the curvature turned too positive or negative. In some embodiments, the buffer layer 100 has a resistivity that varies as an oscillating function as well.

More specifically, the oscillating function has crests C1, C2, and C3 in sequence. As the buffer layer 100 is formed to have a bottom surface in contact with a nucleation layer (e.g., the nucleation layer 12 as shown in FIG. 1), the crest C1 is closer to the bottom surface of the buffer layer 100 than the crest C2. Similarly, as the buffer layer 100 is formed to have a bottom surface in contact with a nucleation layer, the crest C2 is closer to the bottom surface of the buffer layer 100 than the crest C3. The crest C2 is higher than the crest C1 and is lower than the crest C3. The crests C1, C2, and C3 at different heights can result in the oscillating function having amplitude increasing gradually. Moreover, as the buffer layer 100 is formed to have a bottom surface in contact with a nucleation layer, the concentration of aluminum of the buffer layer 100 at the bottom surface is less than the concentration of aluminum of the buffer layer 110 at the crests C1, C2, and C3.

A horizontal distance between the crests C1 and C2 is substantial the same as a horizontal distance between the crests C2 and C3. Regarding "horizontal distances are substantial the same", it results in the oscillating function having constant wavelength. Specifically, the oscillating function include a plurality of waves, and a profile of at least one of the waves is symmetrical about its own vertical center line due to constant wavelength.

the oscillating function has troughs T1, T2, and T3 in sequence. As the buffer layer 100 is formed to have a bottom surface in contact with a nucleation layer, the trough T1 is closer to the bottom surface of the buffer layer 100 than the trough T2. Similarly, as the buffer layer 100 is formed to have a bottom surface in contact with a nucleation layer, the trough T2 is closer to the bottom surface of the buffer layer 100 than the trough T3. The troughs T1, T2, and T3 of the oscillating function are at the same elevation. The troughs T1, T2, and T3 of the oscillating function have the same spacing therebetween.

Figure 4:
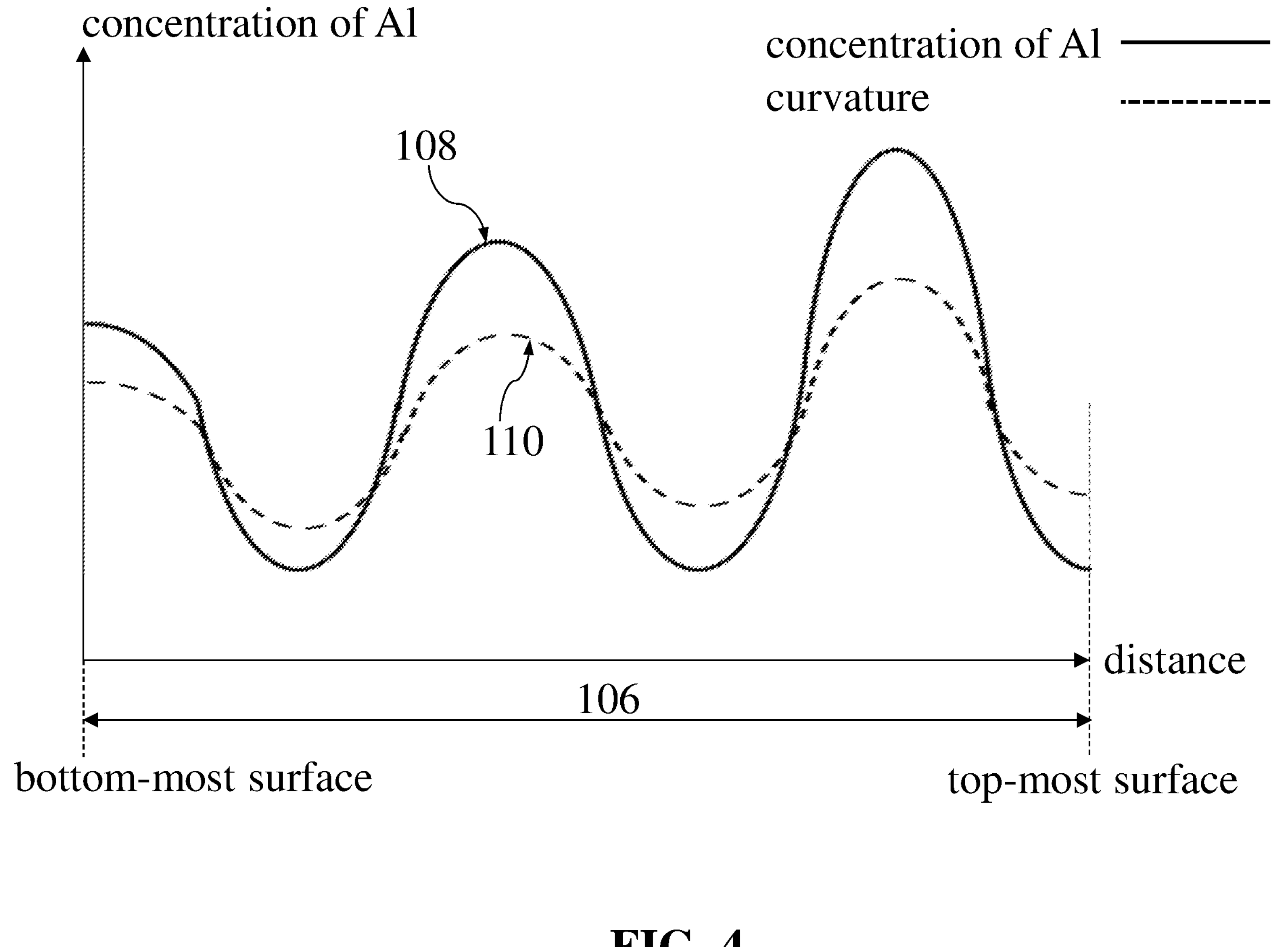
FIG. 4 is a graph showing a variable concentration of aluminum in a buffer layer versus a distance within a thickness of the same according to some embodiments of the present disclosure.

FIG. 4 is a graph showing a variable concentration of aluminum in a buffer layer 106 versus a distance within a thickness of the same according to some embodiments of the present disclosure. In FIG. 4, a bottom-most surface and a top-most surface of the buffer layer 106 are labeled on the corresponding locations at the X-axis for convenient reference. The distance at the X-axis can refer to a distance from the bottom-most surface to the top-most surface of the buffer layer 106, and is in an arbitrary unit. The Y-axis represents the value of the concentration of aluminum in the buffer layer 106, where the unit is "%."

The graph of FIG. 4 reflects a relationship curve 108 for the variable concentration of aluminum. The relationship curve 108 of FIG. 4 is similar with the relationship curve 102 of FIG. 3. In this regard, the relationship curve 108 of FIG. 4 has spacings among adjacent peaks of the oscillating function which are wider than that of the relationship curve 102 of FIG. 3. That is, the relationship curve 108 of FIG. 4 can have fewer cycles than that of relationship curve 102 of FIG. 3 under a condition that the buffer layers 100 and 106 have the same thickness. Accordingly, the graph of FIG. 4 reflects a relationship curve 110 for the curvature of the buffer layer 106 and the relationship curve 110 can have fewer cycles than that of relationship curve 104 of FIG. 3.

In the present disclosure, the difference between FIGS. 3 and 4 can be defined as that the buffer layer 100 is formed with higher oscillation rate of aluminum than that of the buffer layer 106. More specifically, the buffer layers 100 and 106 have different oscillation rates in the concentration of aluminum per unit thickness.

In order to ease the complexity of the explanation in the present disclosure, high and low oscillation rates will be used in the following description, so as to state the oscillating concentrations as shown in FIGS. 3 and 4.

A buffer layer having such concentration of aluminum can be formed by using deposition techniques. The deposition techniques can include, for example but are not limited to, atomic layer deposition (ALD), physical vapor deposition (PVD), chemical vapor deposition (CVD), metal organic CVD (MOCVD), epitaxial growth, or other suitable processes.

During a deposition process for the formation of the buffer layer including aluminum gallium nitride (AlGaN), aluminum, gallium, and nitrogen precursors are introduced into a gas flow in a chamber. An aluminum ratio (i.e., a ratio of the aluminum precursor to all precursors) correlates with an aluminum concentration of the formed buffer layer. Accordingly, with gradually changing the aluminum ratio during the growth of the buffer layer, the buffer layer would be formed to have a variable concentration of aluminum. For example, by decreasing the aluminum ratio over time during the growth of the buffer layer, the buffer layer would be formed to have concentration of aluminum that decrementally decreases.

In some embodiments, decreasing the aluminum ratio can be achieved by decreasing quantity of the aluminum precursor. In some embodiments, decreasing the aluminum ratio can be achieved by increasing quantity of the gallium precursor. In some embodiments, decreasing the aluminum ratio can be achieved by increasing a gallium ratio (i.e., a ratio of the gallium precursor to all precursors). In some embodiments, decreasing the aluminum ratio can be achieved by decreasing a ratio of aluminum to gallium. Similarly, by increasing the aluminum ratio over time during the growth of the buffer layer, the buffer layer would be formed to have concentration of aluminum that incrementally increases. The decreasing/increasing the aluminum ratio per unit time correlates with the oscillation rate in the concentration of aluminum. For example, the faster decreasing/increasing the aluminum ratio per unit time is, the higher oscillation rate in the concentration of aluminum is.

The buffer layer configuration as shown in FIG. 3 or FIG. 4 can be applied in to the buffer layer 14 of the semiconductor device 1A to achieve the modulation to the resistivity of the device.

Referring to FIG. 1 again, the buffer layer 14 can have an optional thickness complying with requirements. In some embodiments, the buffer layer 14 has a thickness over about 1 μm. The thickness of the buffer layer 14 may be varied of interest or can be changed based on the design requirements.

For example, the semiconductor device 1A can be configured to work in a relatively low voltage condition (e.g., about 100V or less) in some embodiments, and the buffer layer 14 can have a thickness in a range from about 1 μm to about 2 μm.

For example, the semiconductor device 1A can be configured to work in a relatively high voltage condition (e.g., over about 100V), and the buffer layer 14 can have a thickness over about 2 μm in some other embodiments. The buffer layer 14 which has relatively greater thickness can endure or withstand relatively greater breakdown voltage. The buffer layer 14 which has relatively greater thickness can endure or withstand relatively greater vertical breakdown voltage.

The operating voltage or work voltage of the semiconductor device 1A can be positively correlated to the breakdown voltage of the buffer layer 14. The operating voltage or work voltage of the semiconductor device 1A can be positively correlated to the vertical breakdown voltage of the buffer layer 14.

For example, the buffer layer 14 can have a thickness in a range from about 1 μm to about 2 μm to endure or withstand a breakdown voltage ranging from about 200V to about 500V in some other embodiments. For example, the buffer layer 14 can have a thickness in a range from about 1 μm to about 2 μm to endure or withstand a vertical breakdown voltage ranging from about 200V to about 500V in some other embodiments.

For example, the buffer layer 14 can have a thickness in a range from about 4 μm to about 10 μm to endure or withstand a breakdown voltage up to about 400V to about 2500V in some other embodiments. For example, the buffer layer 14 can have a thickness in a range from about 4 μm to about 10 μm to endure or withstand a vertical breakdown voltage up to about 400V to about 2500V in some other embodiments.

For example, the buffer layer 14 can have a thickness in a range from about 1 μm to about 50 μm to endure or withstand a breakdown voltage ranging from about 200V to about 12,500V in some other embodiments. For example, the buffer layer 14 can have a thickness in a range from about 1 μm to about 50 μm to endure or withstand a vertical breakdown voltage ranging from about 200V to about 12,500V in some other embodiments. For example, the buffer layer 14 can have a relatively great thickness as the voltage applied to the semiconductor device 1A goes up. In some other embodiments, the buffer layer 14 can have a thickness over about 50 μm to endure or withstand a breakdown voltage over about 12,500V.

For a HEMT device, it is an important factor that if a buffer layer is thick enough. If a buffer layer has a thickness which is not as thick as enough, there would be a leakage current flowing to a bottom substrate. If a buffer layer has a thickness which is as thick as enough but does not have a variable concentration of aluminum as above, there would be a warpage issue occurring across the buffer layer or a layer to be formed on the buffer layer. In this regard, since the buffer layer 14 is formed to have the variable concentration of aluminum as above, the warpage issue is avoided and the buffer layer 14 has the thickness which can avoid occurrence of a leakage current. Moreover, the varied oscillation rate can make the buffer layer 14 have the enough number of the cycles in the oscillation function, so as to fit the layer design.

Referring to FIG. 1 again, the gate structure 30 is disposed on the nitride-based semiconductor layer 22. The gate structure 30 may include a p-type doped III-V compound semiconductor layer 304 and a conductive gate 302. The conductive gate 302 can serve as a metal gate. The p-type doped III-V compound semiconductor layer 304 and the conductive gate 302 are stacked on the nitride-based semiconductor layer 22. The p-type doped III-V compound semiconductor layer 304 is between the nitride-based semiconductor layer 22 and the conductive gate 302. In some embodiments, the gate structure 30 may further include a dielectric layer (not illustrated) between the p-type doped III-V compound semiconductor layer 304 and the conductive gate 302.

The semiconductor device 1A can be designed as being an enhancement mode device, which is in a normally-off state when the conductive gate 302 is at approximately zero bias. Specifically, the p-type doped III-V compound semiconductor layer 304 creates a p-n junction with the nitride-based semiconductor layer 112 to deplete the 2DEG region, such that a zone of the 2DEG region corresponding to a position below the gate structure 30 has different characteristics (e.g., different electron concentrations) than the rest of the 2DEG region and thus is blocked. Due to such mechanism, the semiconductor device 1A has a normally-off characteristic. In other words, when no voltage is applied to the conductive gate 302 or a voltage applied to the conductive gate 302 is less than a threshold voltage (i.e., a minimum voltage required to form an inversion layer below the gate structure 30), the zone of the 2DEG region below the gate structure 30 is kept blocked, and thus no current flows therethrough. Moreover, by providing the p-type doped III-V compound semiconductor layer 304, gate leakage current is reduced and an increase in the threshold voltage during the off-state is achieved.

In some embodiments, the optimal p-type doped III-V compound semiconductor layer 304 can be omitted, such that the semiconductor device 1A is a depletion-mode device, which means the semiconductor device 1A in a normally-on state at zero gate-source voltage.

The exemplary materials of the p-type doped III-V compound semiconductor layer 304 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd. In some embodiments, the nitride-based semiconductor layer 20 includes undoped GaN and the nitride-based semiconductor layer 22 includes AlGaN, and the p-type doped III-V compound semiconductor layer 304 is a p-type GaN layer which can bend the underlying band structure upwards and to deplete the corresponding zone of the 2DEG region, so as to place the semiconductor device 1A into an off-state condition.

In some embodiments, the conductive gate 302 may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. In some embodiments, the exemplary materials of the conductive gate 302 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc), or combinations thereof.

The passivation layer 40 is disposed over the nitride-based semiconductor layer 22. The passivation layer 40 covers the gate structure 30 for a protection purpose. The passivation layer 40 is conformal with the gate structure 30 and thus has a projection profile over the gate structure 30. The exemplary materials of the passivation layer 40 can include, for example but are not limited to, $SiN_x$, $SiO_x$, SiON, SiC, SiBN, SiCBN, oxides, nitrides, or combinations thereof. In some embodiments, the passivation layer 40 is a multi-layered structure, such as a composite dielectric layer of $Al_2O_3$/SiN, $Al_2O_3$/$SiO_2$, AlN/SiN, AlN/$SiO_2$, or combinations thereof.

The S/D electrodes 42 and 44 are disposed on the nitride-based semiconductor layer 22. The S/D electrodes 42 and 44 can serve a combination of a source and a drain. The S/D electrodes 42 and 44 are located at two opposite sides of the gate structure 30 (i.e., the gate structure 30 is located between the S/D electrodes 42 and 44). The gate structure 30 and the S/D electrodes 42 and 44 can collectively act as a GaN-based HEMT with the 2DEG region.

The S/D electrodes 42 and 44 have bottom portions penetrating the passivation layer 40 to form interfaces with the nitride-based semiconductor layer 22. The S/D electrodes 42 and 44 have top portions wider than the bottom portions thereof. The top portions of the S/D electrodes 42 and 44 extend over portions of the passivation layer 40.

In the exemplary illustration of FIG. 1, the left and right S/D electrodes 42 and 44 serve as source and drain electrodes, respectively. Although it is not shown in FIG. 1, the S/D electrodes 42 and 44 may be optionally asymmetrical about the gate structure 30. In some embodiments, the left S/D electrode 132 is closer to the gate structure 30 than the right S/D electrode 134. The present disclosure is not limited thereto, and the configuration of the S/D electrodes 42 and 44 is adjustable.

In some embodiments, each of the S/D electrodes 42 and 44 includes one or more conformal conductive layers. In some embodiments, the S/D electrodes 42 and 44 can include, for example but are not limited to, metals, alloys, doped semiconductor materials (such as doped crystalline silicon), other conductor materials, or combinations thereof. The exemplary materials of the S/D electrodes 42 and 44 can include, for example but are not limited to, Ti, AlSi, TiN, or combinations thereof. In some embodiments, each of the S/D electrodes 42 and 44 forms ohmic contact with the nitride-based semiconductor layer 22. The ohmic contact can be achieved by applying Ti, Al, or other suitable materials for the S/D electrodes 42 and 44.

In some embodiments, the number of the S/D electrodes can be increased, and the number of the gate electrodes is corresponding increased as well. For example, the semiconductor device 1A can have three S/D electrodes and two gate electrodes located among the S/D electrodes.

The passivation layer 50 is disposed above the passivation layer 40 and the S/D electrodes 42 and 44. The passivation layer 50 covers the GaN-based HEMT. The passivation layer 50 covers the S/D electrodes 42 and 44. The passivation layer 50 forms interfaces with sidewalls and top surfaces of the S/D electrodes 42 and 44. The passivation layer 50 may have a flat topmost surface, which is able to act as a flat base for carrying layers formed in a step subsequent to the formation thereof. The exemplary materials of the passivation layer 50 can include, for example but are not limited to, $SiN_x$, $SiO_x$, SiON, SiC, SiBN, SiCBN, oxides, nitrides, or combinations thereof. In some embodiments, the passivation layer 40 is a multi-layered structure, such as a composite dielectric layer of $Al_2O_3$/SiN, $Al_2O_3$/$SiO_2$, AlN/SiN, AlN/$SiO_2$, or combinations thereof.

The contact vias 52 penetrate the passivation layer 50 to connect to the gate structure 30 and the S/D electrodes 42 and 44. The contact vias 52 form interfaces with the gate structure 30 and the S/D electrodes 42 and 44. The exemplary materials of the contact vias 52 can include, for example but are not limited to, Cu, Al, or combinations thereof.

The patterned conductive layer 54 is disposed on the passivation layer 50. The patterned conductive layer 54 has a plurality of metal lines over the gate structure 30 and the S/D electrodes 42 and 44 for the purpose of implementing interconnects between circuits. The metal lines are in contact with the contact vias 52, respectively, such that the gate structure 30 and the S/D electrodes 42 and 44 can be arranged into a circuit. For example, the GaN-based HEMT can be electrically connected to other component(s) via the metal lines of the patterned conductive layer 54. In other embodiments, the patterned conductive layer 54 may include pads or traces for the same purpose.

To manufacturing the semiconductor device 1A, after the formation of the buffer layer 14, the nitride-based semiconductor layers 20 and 22, the gate structure 30, the passivation layer 40, the S/D electrodes 42 and 44, the passivation layer 40, the contact vias 52, and the patterned conductive layer 54 are formed over the buffer layer 14.

The following description states more configurations for a buffer layer. Those configurations also can be applied to the buffer layer 14 of the semiconductor device 1A to achieve the modulation.

Figure 5:
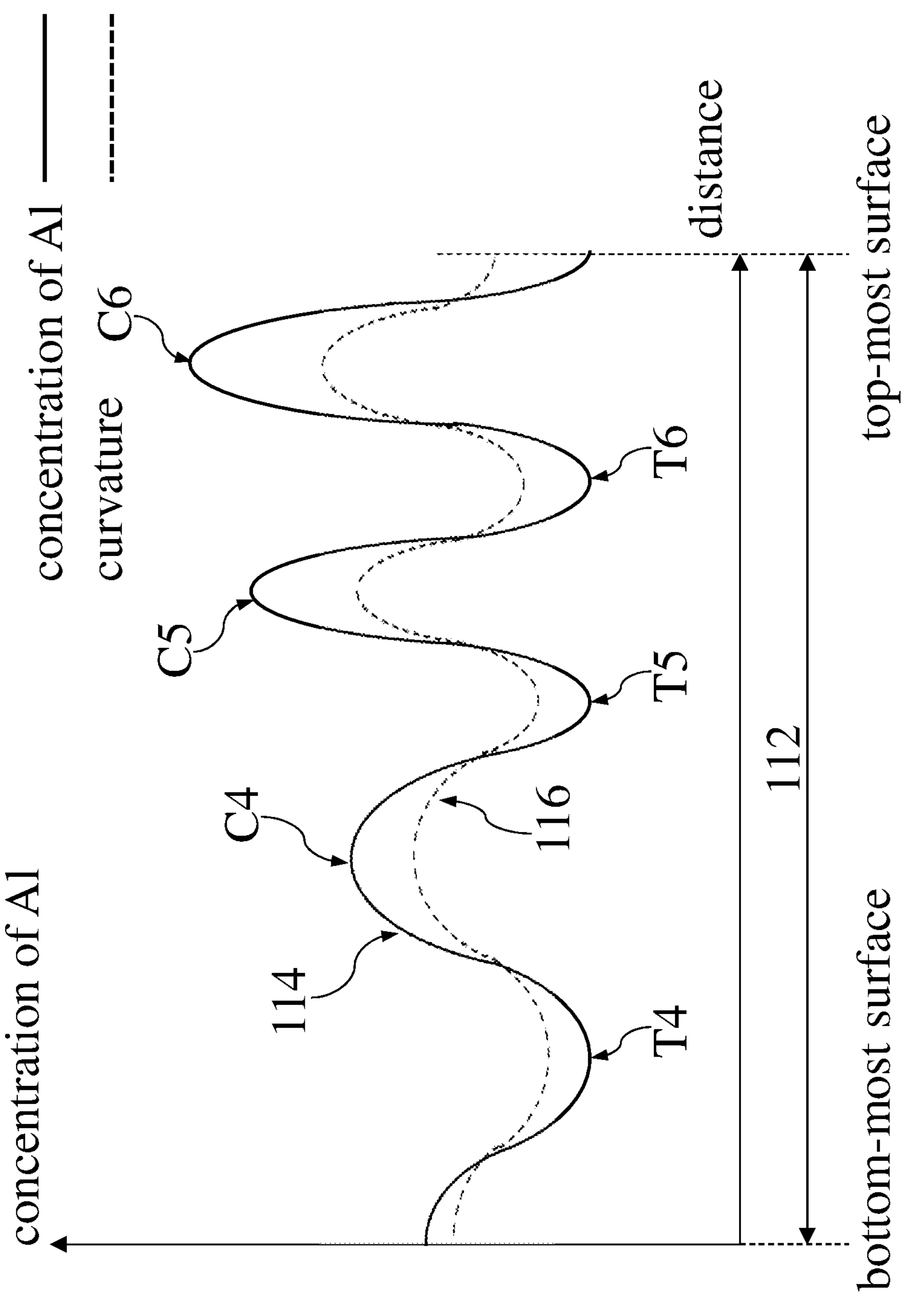
FIG. 5 is a graph showing a variable concentration of aluminum in the buffer layer versus a distance within a thickness of the same according to some embodiments of the present disclosure.

FIG. 5 is a graph showing a variable concentration of aluminum in the buffer layer 112 versus a distance within a thickness of the same according to some embodiments of the present disclosure. The buffer layer 112 can have a concentration of aluminum oscillating within the buffer layer 112, such that the concentration of aluminum varies as an oscillating function of a distance within a thickness of the buffer layer 112, as shown in a relationship curve 114 which represents an oscillating curve.

The oscillating function has a profile that is a low oscillation rate in combination with a high oscillation rate.

Along the cyclical oscillation, the aluminum concentration will gradually increase. With the gradually increasing, the resistivity of the buffer layer 112 can be modulated to get greater. Such manner can avoid the trend of the curvature turned too positive or negative, as shown in a relationship curve 116 which represents a curvature trend. In some embodiments, the buffer layer 112 has a resistivity that varies as an oscillating function as well.

More specifically, the oscillating function has crests C4, C5, and C6 in sequence. As the buffer layer 112 is formed to have a bottom surface in contact with a nucleation layer (e.g., the nucleation layer 12 as shown in FIG. 1), the crest C4 is closer to the bottom surface of the buffer layer 112 than the crest C5. Similarly, as the buffer layer 112 is formed to have a bottom surface in contact with a nucleation layer, the crest C5 is closer to the bottom surface of the buffer layer 112 than the crest C6. The crest C5 is higher than the crest C4 and is lower than the crest C6. The crests C4, C5, and C6 at different heights can result in the oscillating function having amplitude increasing gradually. Moreover, as the buffer layer 112 is formed to have a bottom surface in contact with a nucleation layer, the concentration of aluminum of the buffer layer 112 at the bottom surface is less than the concentration of aluminum of the buffer layer 112 at the crests C4, C5, and C6.

A horizontal distance between the crests C4 and C5 differs than a horizontal distance between the crests C5 and C6. The horizontal distance between the crests C4 and C5 is greater than the horizontal distance between the crests C5 and C6. It results in the oscillating function having varied wavelength. Specifically, the wave profile where the crest C4 belongs to is different than the wave profile where the crest C5 or C6 belongs to. The wavelength which the crest C4 corresponds with is different than the wavelength which the crest C5 or C6 corresponds with. At least one of the waves is symmetrical about its own vertical center line.

The oscillating function has troughs T4, T5, and T6 in sequence. As the buffer layer 112 is formed to have a bottom surface in contact with a nucleation layer, the trough T4 is closer to the bottom surface of the buffer layer 112 than the trough T5. Similarly, as the buffer layer 112 is formed to have a bottom surface in contact with a nucleation layer, the trough T5 is closer to the bottom surface of the buffer layer 112 than the trough T6. The troughs T4, T5, and T6 of the oscillating function are at the same elevation.

Figure 6:
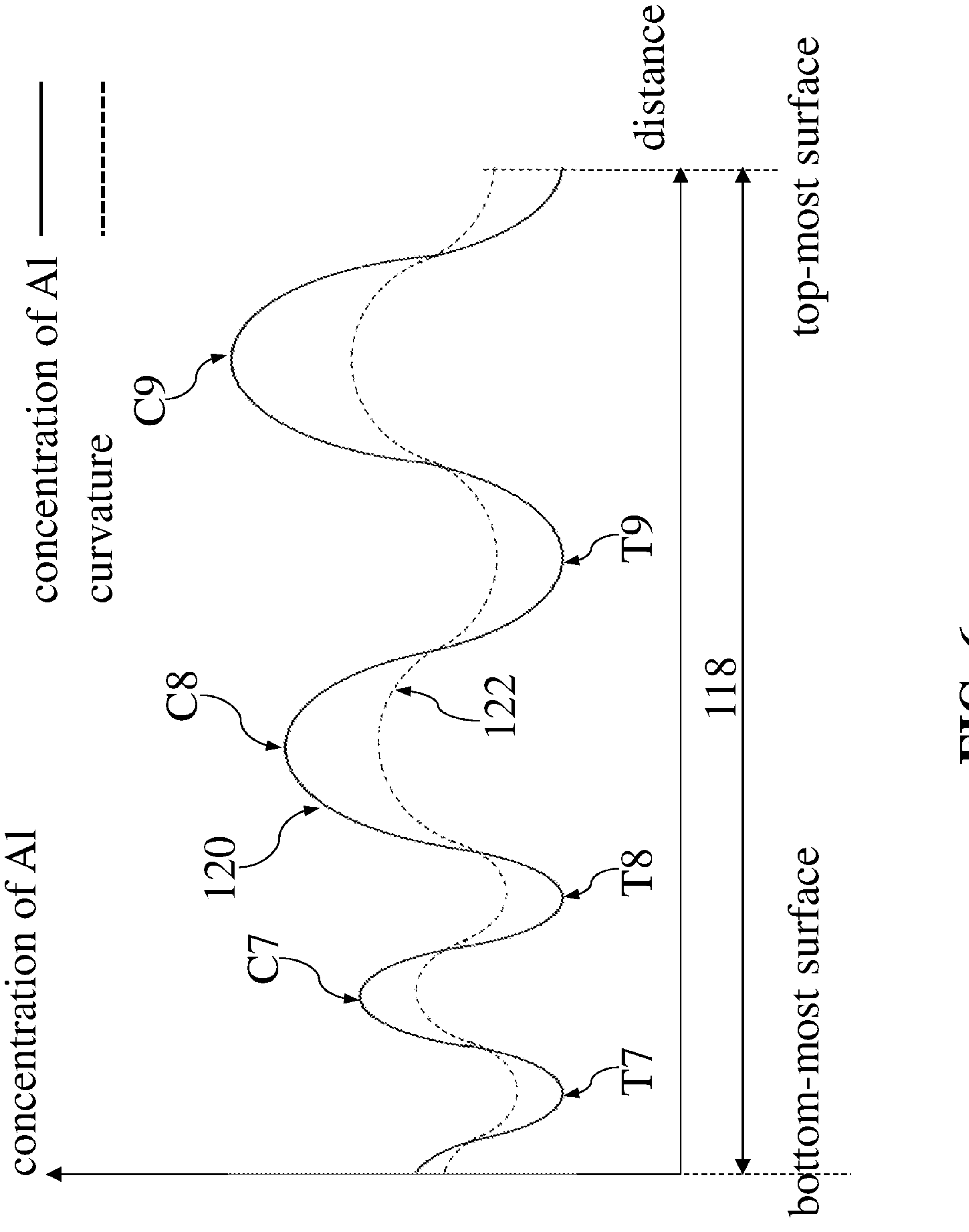
FIG. 6 is a graph showing a variable concentration of aluminum in a buffer layer versus a distance within a thickness of the same according to some embodiments of the present disclosure.

FIG. 6 is a graph showing a variable concentration of aluminum in the buffer layer 118 versus a distance within a thickness of the same according to some embodiments of the present disclosure. The buffer layer 118 can have a concentration of aluminum oscillating within the buffer layer 118, such that the concentration of aluminum varies as an oscillating function of a distance within a thickness of the buffer layer 118, as shown in a relationship curve 120 which represents an oscillating curve.

The oscillating function has a profile that is a high oscillation rate in combination with a low oscillation rate.

Along the cyclical oscillation, the aluminum concentration will gradually increase. With the gradually increasing, the resistivity of the buffer layer 118 can be modulated to get greater. Such manner can avoid the trend of the curvature turned too positive or negative, as shown in a relationship curve 122 which represents a curvature trend. In some embodiments, the buffer layer 118 has a resistivity that varies as an oscillating function as well.

More specifically, the oscillating function has crests C7, C8, and C9 in sequence. As the buffer layer 118 is formed to have a bottom surface in contact with a nucleation layer (e.g., the nucleation layer 12 as shown in FIG. 1), the crest C7 is closer to the bottom surface of the buffer layer 118 than the crest C8. Similarly, as the buffer layer 118 is formed to have a bottom surface in contact with a nucleation layer, the crest C8 is closer to the bottom surface of the buffer layer 118 than the crest C9. The crest C8 is higher than the crest C7 and is lower than the crest C9. The crests C7, C8, and C9 at different heights can result in the oscillating function having amplitude increasing gradually. Moreover, as the buffer layer 118 is formed to have a bottom surface in contact with a nucleation layer, the concentration of aluminum of the buffer layer 118 at the bottom surface is less than the concentration of aluminum of the buffer layer 118 at the crests C7, C8, and C9.

A horizontal distance between the crests C7 and C8 differs than a horizontal distance between the crests C8 and C9. The horizontal distance between the crests C7 and C8 is less than the horizontal distance between the crests C8 and C9. It results in the oscillating function having varied wavelength. Specifically, the wave profile where the crest C7 belongs to is different than the wave profile where the crest C8 or C9 belongs to. The wavelength which the crest C7 corresponds with is different than the wavelength which the crest C8 or C9 corresponds with. At least one of the waves is symmetrical about its own vertical center line.

The oscillating function has troughs T7, T8, and T9 in sequence. As the buffer layer 118 is formed to have a bottom surface in contact with a nucleation layer, the trough T7 is closer to the bottom surface of the buffer layer 118 than the trough T8. Similarly, as the buffer layer 118 is formed to have a bottom surface in contact with a nucleation layer, the trough T8 is closer to the bottom surface of the buffer layer 118 than the trough T9. The troughs T7, T8, and T9 of the oscillating function are at the same elevation.

Figure 7:
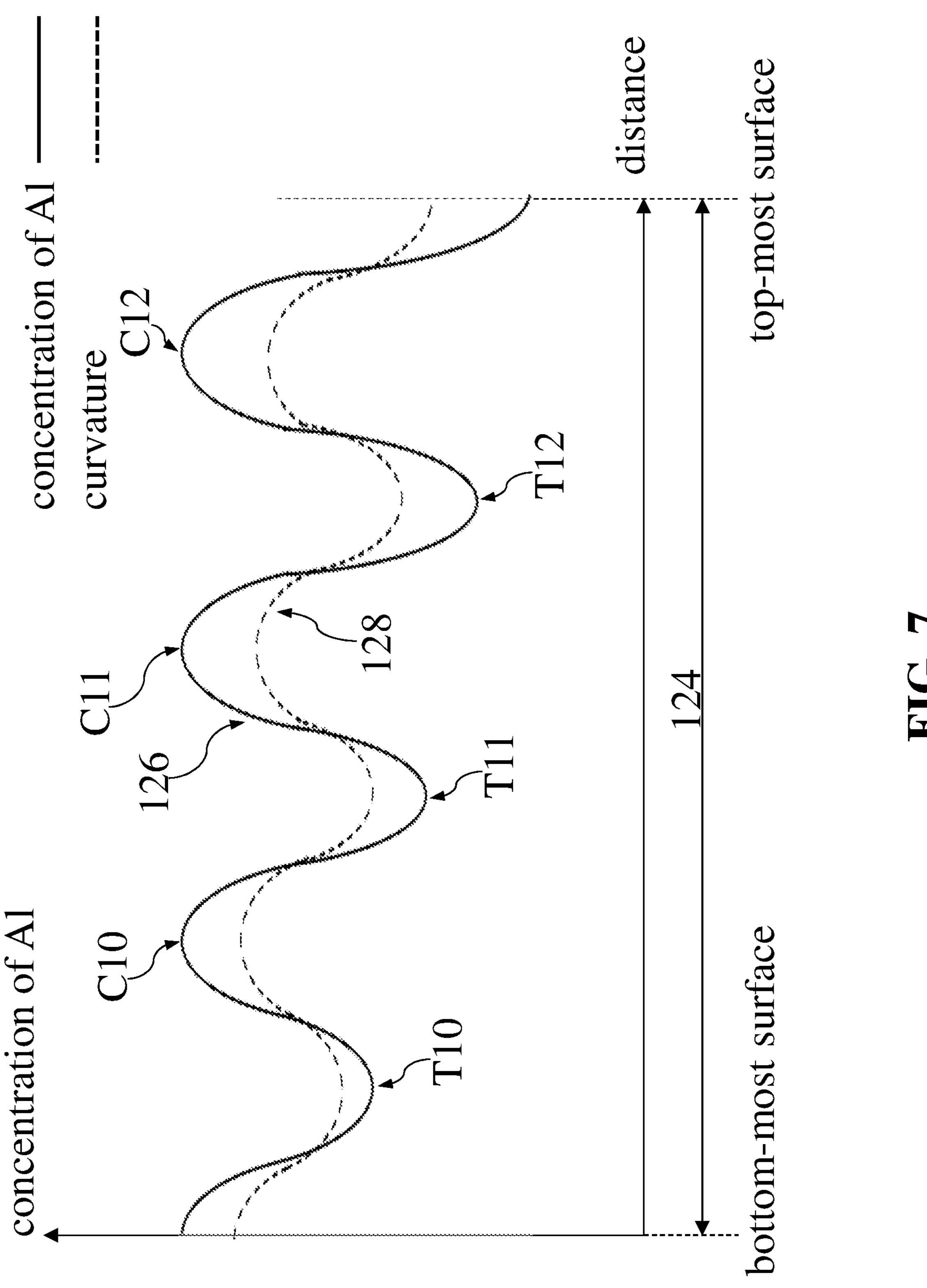
FIG. 7 is a graph showing a variable concentration of aluminum in a buffer layer versus a distance within a thickness of the same according to some embodiments of the present disclosure.

FIG. 7 is a graph showing a variable concentration of aluminum in the buffer layer 124 versus a distance within a thickness of the same according to some embodiments of the present disclosure. The buffer layer 124 can have a concentration of aluminum oscillating within the buffer layer 124, such that the concentration of aluminum varies as an oscillating function of a distance within a thickness of the buffer layer 124, as shown in a relationship curve 126 which represents an oscillating curve.

Along the cyclical oscillation, the aluminum concentration gradually oscillates. With the gradually oscillating, the resistivity of the buffer layer 124 can be modulated to get oscillating as well. The average resistivity of the buffer layer 124 can be improved as compared with an aluminum concentration directly increasing or decreasing. Such manner can avoid the trend of the curvature turned becoming too positive or too negative, as shown in a relationship curve 128 which represents a curvature trend. In some embodiments, the buffer layer 124 has a resistivity that varies as an oscillating function as well.

More specifically, the oscillating function has crests C10, C11, and C12 in sequence and has troughs T10, T11, and T12 in sequence. From a bottom surface to a top surface of the buffer layer 124, there are the trough T10, the crest C10, the trough T11, the crest C11, the trough T12, and the crest C12.

As the buffer layer 124 is formed to have a bottom surface in contact with a nucleation layer (e.g., the nucleation layer 12 as shown in FIG. 1), the crest C10 is closer to the bottom surface of the buffer layer 124 than the crest C11. Similarly, as the buffer layer 124 is formed to have a bottom surface in contact with a nucleation layer, the crest C11 is closer to the bottom surface of the buffer layer 124 than the crest C12.

As the buffer layer 124 is formed to have a bottom surface in contact with a nucleation layer (e.g., the nucleation layer 12 as shown in FIG. 1), the trough T10 is closer to the bottom surface of the buffer layer 124 than the trough T11. Similarly, as the buffer layer 124 is formed to have a bottom surface in contact with a nucleation layer, the trough T11 is closer to the bottom surface of the buffer layer 124 than the trough T12.

The trough T10 is high than the trough T11. The height difference between the crests C10 and C11 is less than the height difference between the troughs T10 and T11. In some embodiments, the crests C10 and C11 are at substantially the same elevation. The trough T11 is high than the trough T12. The height difference between the crests C11 and C12 is less than the height difference between the troughs T11 and T12. In some embodiments, the crests C11 and C12 are at substantially the same elevation. Since the troughs T10, T11, and T12 get lower along a direction, the oscillating function has amplitude increasing gradually.

Moreover, as the buffer layer 124 is formed to have a bottom surface in contact with a nucleation layer, the concentration of aluminum of the buffer layer 124 at the bottom surface is substantially the same as the concentration of aluminum of the buffer layer 124 at the crests C10, C11, and C12.

The horizontal distance between the crests C10 and C11 is substantially the same as the horizontal distance between the crests C11 and C12. The horizontal distance between the troughs T10 and T11 is substantially the same as the horizontal distance between the troughs T11 and T12. It results in the oscillating function having a contact wavelength.

Figure 8:
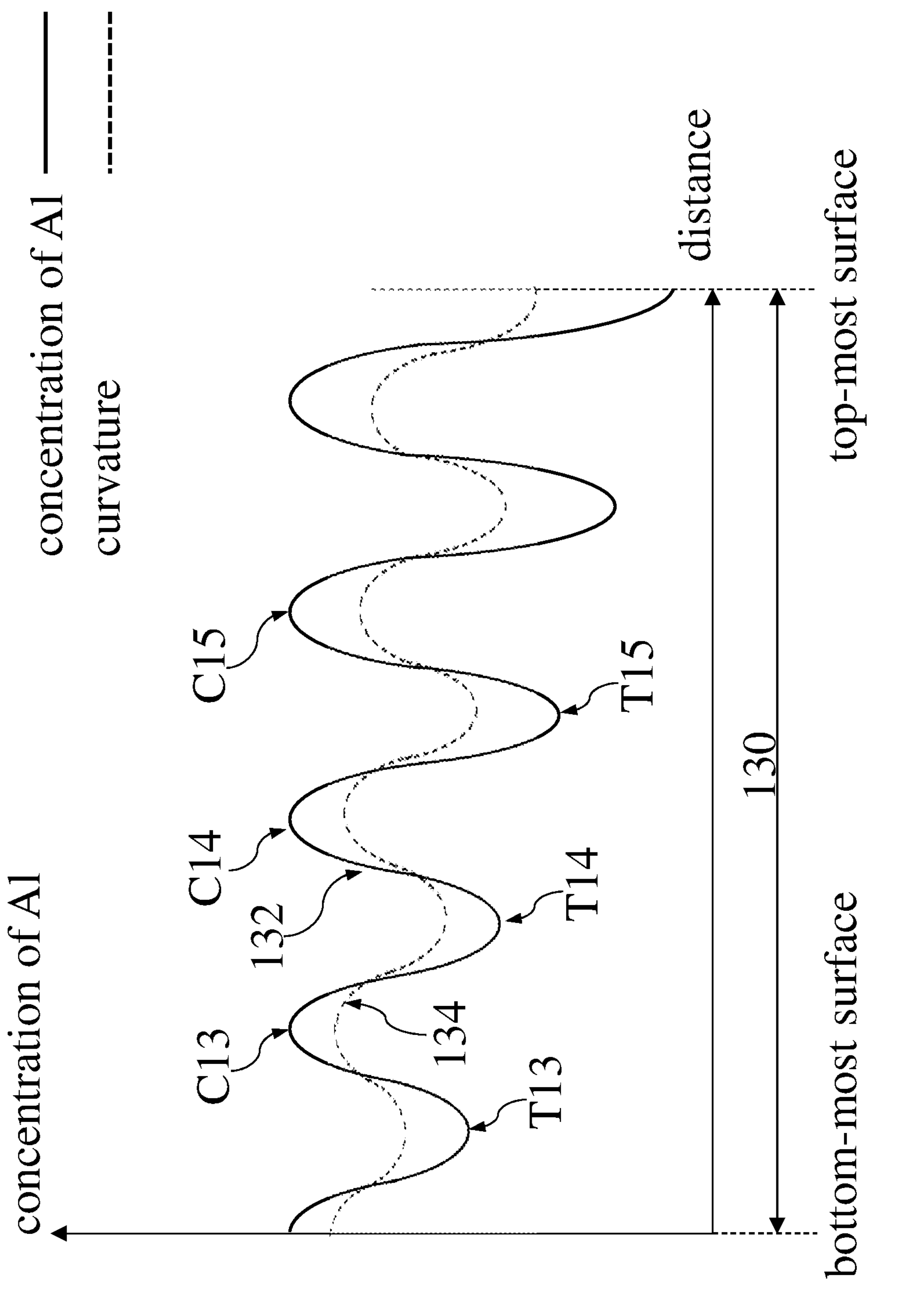
FIG. 8 is a graph showing a variable concentration of aluminum in a buffer layer versus a distance within a thickness of the same according to some embodiments of the present disclosure.

FIG. 8 is a graph showing a variable concentration of aluminum in the buffer layer 130 versus a distance within a thickness of the same according to some embodiments of the present disclosure. The buffer layer 130 can have a concentration of aluminum oscillating within the buffer layer 130, such that the concentration of aluminum varies as an oscillating function of a distance within a thickness of the buffer layer 130, as shown in a relationship curve 132 which represents an oscillating curve.

Along the cyclical oscillation, the aluminum concentration gradually oscillates. With the gradually oscillating, the resistivity of the buffer layer 130 can be modulated to get oscillating as well. The average resistivity of the buffer layer 130 can be improved as compared with an aluminum concentration directly increasing or decreasing. Such manner can avoid the trend of the curvature turned becoming too positive or too negative, as shown in a relationship curve 134 which represents a curvature trend. In some embodiments, the buffer layer 130 has a resistivity that varies as an oscillating function as well.

More specifically, the oscillating function has crests C13, C14, and C15 in sequence and has troughs T13, T14, and T15 in sequence. From a bottom surface to a top surface of the buffer layer 130, there are the trough T13, the crest C13, the trough T14, the crest C14, the trough T15, and the crest C15.

As the buffer layer 130 is formed to have a bottom surface in contact with a nucleation layer (e.g., the nucleation layer 12 as shown in FIG. 1), the crest C13 is closer to the bottom surface of the buffer layer 130 than the crest C14. Similarly, as the buffer layer 130 is formed to have a bottom surface in contact with a nucleation layer, the crest C14 is closer to the bottom surface of the buffer layer 130 than the crest C15.

As the buffer layer 130 is formed to have a bottom surface in contact with a nucleation layer (e.g., the nucleation layer 12 as shown in FIG. 1), the trough T13 is closer to the bottom surface of the buffer layer 130 than the trough T14. Similarly, as the buffer layer 130 is formed to have a bottom surface in contact with a nucleation layer, the trough T14 is closer to the bottom surface of the buffer layer 130 than the trough T15.

The trough T13 is high than the trough T14. The height difference between the crests C13 and C14 is less than the height difference between the troughs T13 and T14. In some embodiments, the crests C13 and C14 are at substantially the same elevation. The trough T14 is high than the trough T15. The height difference between the crests C14 and C15 is less than the height difference between the troughs T14 and T15. In some embodiments, the crests C14 and C15 are at substantially the same elevation. Since the troughs T13, T14, and T15 get lower along a direction, the oscillating function has amplitude increasing gradually.

Moreover, as the buffer layer 130 is formed to have a bottom surface in contact with a nucleation layer, the concentration of aluminum of the buffer layer 130 at the bottom surface is substantially the same as the concentration of aluminum of the buffer layer 130 at the crests C13, C14, and C15.

The horizontal distance between the crests C13 and C14 is substantially the same as the horizontal distance between the crests C14 and C15. The horizontal distance between the troughs T13 and T14 is substantially the same as the horizontal distance between the troughs T14 and T15. It results in the oscillating function having a contact wavelength.

In the present disclosure, the difference between FIGS. 7 and 8 can be defined as that the buffer layer 124 is formed with lower oscillation rate of aluminum than that of the buffer layer 130. More specifically, the buffer layers 124 and 130 have different oscillation rates in the concentration of aluminum per unit thickness.

In order to ease the complexity of the explanation in the present disclosure, low and high oscillation rates will be used in the following description, so as to state the oscillating concentrations as shown in FIGS. 7 and 8.

Figure 9:
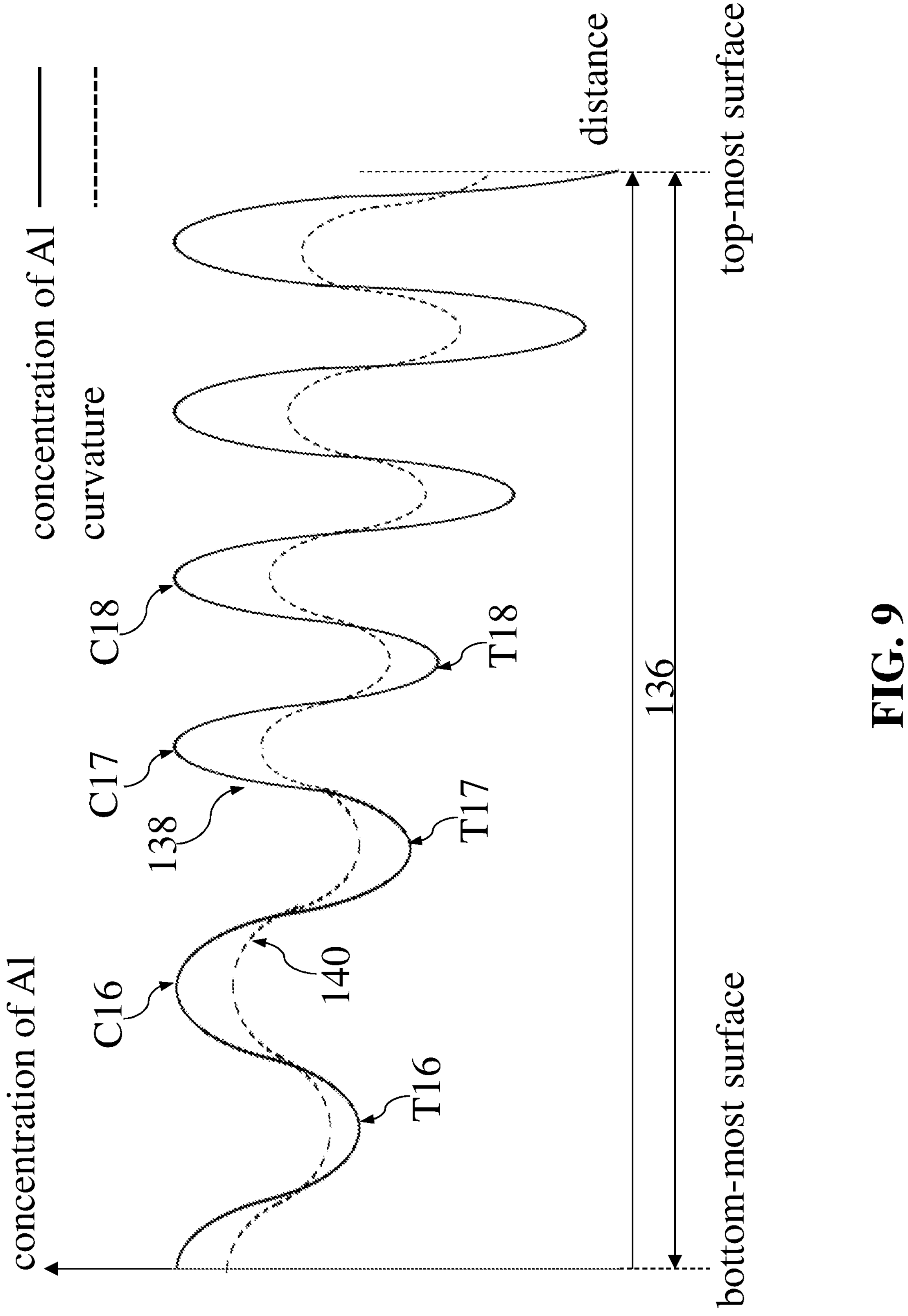
FIG. 9 is a graph showing a variable concentration of aluminum in a buffer layer versus a distance within a thickness of the same according to some embodiments of the present disclosure.

FIG. 9 is a graph showing a variable concentration of aluminum in the buffer layer 136 versus a distance within a thickness of the same according to some embodiments of the present disclosure. The buffer layer 136 can have a concentration of aluminum oscillating within the buffer layer 136, such that the concentration of aluminum varies as an oscillating function of a distance within a thickness of the buffer layer 136, as shown in a relationship curve 138 which represents an oscillating curve.

The oscillating function has a profile that is a low oscillation rate in combination with a high oscillation rate.

Along the cyclical oscillation, the aluminum concentration gradually oscillates. With the gradually oscillating, the resistivity of the buffer layer 136 can be modulated to get oscillating as well. The average resistivity of the buffer layer 136 can be improved as compared with an aluminum concentration directly increasing or decreasing. Such manner can avoid the trend of the curvature turned becoming too positive or too negative, as shown in a relationship curve 140 which represents a curvature trend. In some embodiments, the buffer layer 136 has a resistivity that varies as an oscillating function as well.

More specifically, the oscillating function has crests C16, C17, and C18 in sequence and has troughs T16, T17, and T18 in sequence. From a bottom surface to a top surface of the buffer layer 136, there are the trough T16, the crest C16, the trough T17, the crest C17, the trough T18, and the crest C18.

As the buffer layer 136 is formed to have a bottom surface in contact with a nucleation layer (e.g., the nucleation layer 12 as shown in FIG. 1), the crest C16 is closer to the bottom surface of the buffer layer 130 than the crest C17. Similarly, as the buffer layer 130 is formed to have a bottom surface in contact with a nucleation layer, the crest C17 is closer to the bottom surface of the buffer layer 130 than the crest C18.

As the buffer layer 136 is formed to have a bottom surface in contact with a nucleation layer (e.g., the nucleation layer 12 as shown in FIG. 1), the trough T16 is closer to the bottom surface of the buffer layer 136 than the trough T17. Similarly, as the buffer layer 136 is formed to have a bottom surface in contact with a nucleation layer, the trough T17 is closer to the bottom surface of the buffer layer 130 than the trough T18.

The trough T16 is high than the trough T17. The height difference between the crests C16 and C17 is less than the height difference between the troughs T16 and T17. In some embodiments, the crests C16 and C17 are at substantially the same elevation. The trough T17 is high than the trough T18. The height difference between the crests C17 and C18 is less than the height difference between the troughs T17 and T18. In some embodiments, the crests C17 and C18 are at substantially the same elevation. In some embodiments, as the crests C19, C20, C21 are at substantially the same elevation, the concentration of aluminum of the buffer layer 136 at the bottom surface is the same as the concentration of aluminum of the buffer layer 136 at the crests C19, C20, and C21. Since the troughs T16, T17, and T18 get lower along a direction, the oscillating function has amplitude increasing gradually.

Moreover, as the buffer layer 136 is formed to have a bottom surface in contact with a nucleation layer, the concentration of aluminum of the buffer layer 136 at the bottom surface is substantially the same as the concentration of aluminum of the buffer layer 136 at the crests C16, C17, and C18.

A horizontal distance between the crests C16 and C17 differs from a horizontal distance between the crests C17 and C18. In some embodiments, the horizontal distance between the crests C16 and C17 is greater than the horizontal distance between the crests C17 and C18. A horizontal distance between the troughs T16 and T17 differs from a horizontal distance between the troughs T17 and T18. In some embodiments, the horizontal distance between the troughs T16 and T17 is greater than the horizontal distance between the troughs T17 and T18. A horizontal distance between the crest C16 and the trough T17 differs from a horizontal distance between the crest C17 and the trough T18. In some embodiments, the horizontal distance between the crest C16 and the trough T17 is greater than the horizontal distance between the crest C17 and the trough T18.

It results in the oscillating function that has wavelength varying gradually. Specifically, the wave profile where the crest C16 belongs to is different than the wave profile where the crest C17 or C18 belongs to. The wavelength which the crest C16 corresponds with is different than the wavelength which the crest C17 or C18 corresponds with. At least one of the waves is symmetrical about its own vertical center line.

Figure 10:
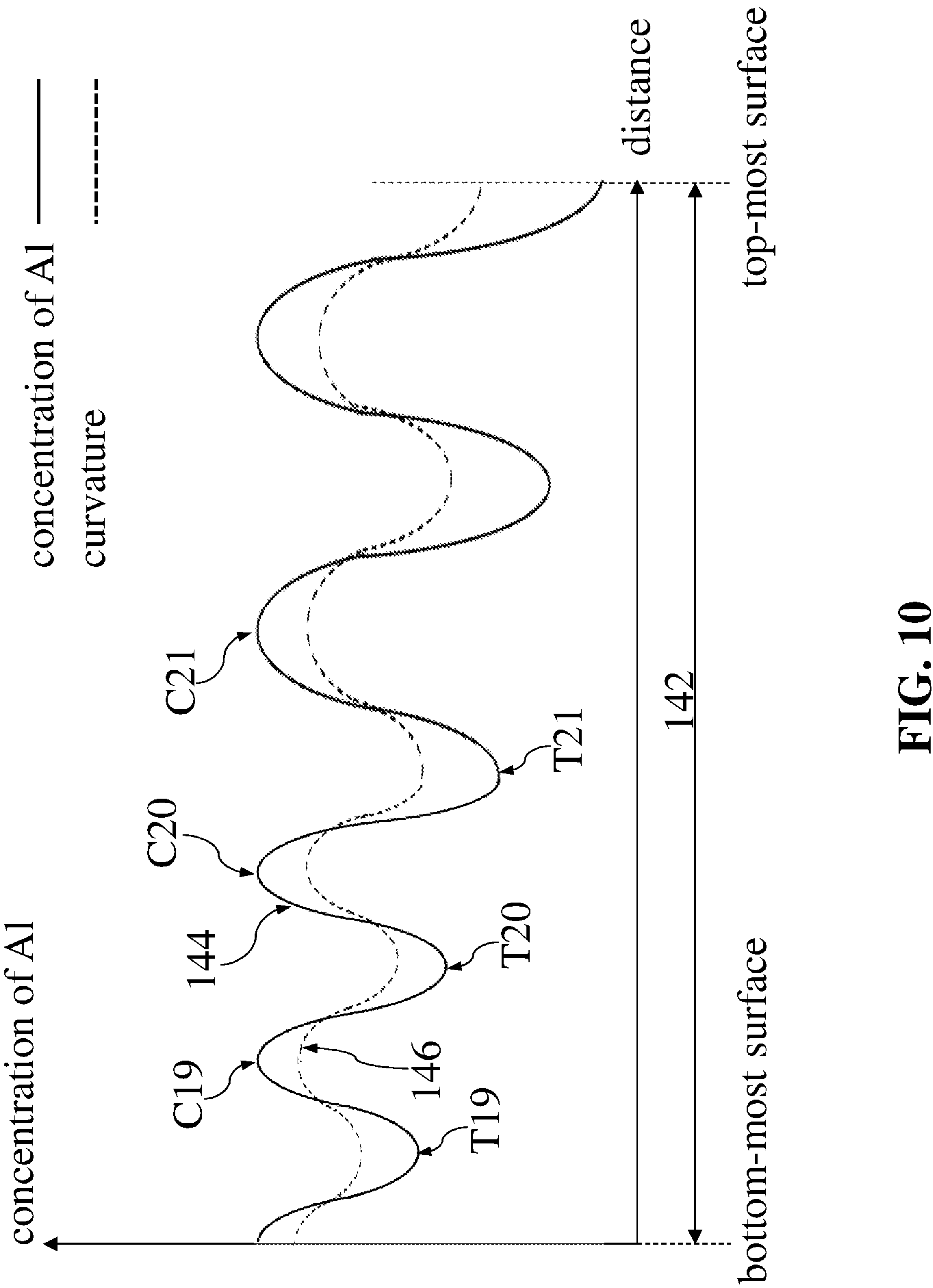
FIG. 10 is a graph showing a variable concentration of aluminum in a buffer layer versus a distance within a thickness of the same according to some embodiments of the present disclosure.

FIG. 10 is a graph showing a variable concentration of aluminum in the buffer layer 142 versus a distance within a thickness of the same according to some embodiments of the present disclosure. The buffer layer 142 can have a concentration of aluminum oscillating within the buffer layer 142, such that the concentration of aluminum varies as an oscillating function of a distance within a thickness of the buffer layer 142, as shown in a relationship curve 144 which represents an oscillating curve.

The oscillating function has a profile that is a low oscillation rate in combination with a high oscillation rate.

Along the cyclical oscillation, the aluminum concentration gradually oscillates. With the gradually oscillating, the resistivity of the buffer layer 142 can be modulated to get oscillating as well. The average resistivity of the buffer layer 142 can be improved as compared with an aluminum concentration directly increasing or decreasing. Such manner can avoid the trend of the curvature turned becoming too positive or too negative, as shown in a relationship curve 146 which represents a curvature trend. In some embodiments, the buffer layer 142 has a resistivity that varies as an oscillating function as well.

More specifically, the oscillating function has crests C19, C20, and C21 in sequence and has troughs T19, T20, and T21 in sequence. From a bottom surface to a top surface of the buffer layer 142, there are the trough T19, the crest C19, the trough T20, the crest C20, the trough T21, and the crest C21.

As the buffer layer 142 is formed to have a bottom surface in contact with a nucleation layer (e.g., the nucleation layer 12 as shown in FIG. 1), the crest C19 is closer to the bottom surface of the buffer layer 142 than the crest C20. Similarly, as the buffer layer 142 is formed to have a bottom surface in contact with a nucleation layer, the crest C20 is closer to the bottom surface of the buffer layer 142 than the crest C21.

As the buffer layer 142 is formed to have a bottom surface in contact with a nucleation layer (e.g., the nucleation layer 12 as shown in FIG. 1), the trough T19 is closer to the bottom surface of the buffer layer 142 than the trough T20. Similarly, as the buffer layer 142 is formed to have a bottom surface in contact with a nucleation layer, the trough T20 is closer to the bottom surface of the buffer layer 142 than the trough T21.

The trough T19 is high than the trough T20. The height difference between the crests C19 and C20 is less than the height difference between the troughs T19 and T20. In some embodiments, the crests C19 and C20 are at substantially the same elevation. The trough T20 is high than the trough T21. The height difference between the crests C20 and C21 is less than the height difference between the troughs T20 and T21. In some embodiments, the crests C20 and C21 are at substantially the same elevation. In some embodiments, as the crests C19, C20, C21 are at substantially the same elevation, the concentration of aluminum of the buffer layer 136 at the bottom surface is the same as the concentration of aluminum of the buffer layer 136 at the crests C19, C20, and C21. Since the troughs T19, T20, and T21 get lower along a direction, the oscillating function has amplitude increasing gradually.

Moreover, as the buffer layer 142 is formed to have a bottom surface in contact with a nucleation layer, the concentration of aluminum of the buffer layer 142 at the bottom surface is substantially the same as the concentration of aluminum of the buffer layer 142 at the crests C19, C20, and C21.

A horizontal distance between the crests C19 and C20 differs from a horizontal distance between the crests C20 and C21. In some embodiments, the horizontal distance between the crests C19 and C20 is less than the horizontal distance between the crests C20 and C21. A horizontal distance between the troughs T19 and T20 differs from a horizontal distance between the troughs T20 and T21. In some embodiments, the horizontal distance between the troughs T19 and T20 is less than the horizontal distance between the troughs T20 and T21. A horizontal distance between the crest C19 and the trough T20 differs from a horizontal distance between the crest C20 and the trough T21. In some embodiments, the horizontal distance between the crest C19 and the trough T20 is less than the horizontal distance between the crest C20 and the trough T21.

It results in the oscillating function that has wavelength varying gradually. Specifically, the wave profile where the crest C19 belongs to is different than the wave profile where the crest C20 or C21 belongs to. The wavelength which the crest C19 corresponds with is different than the wavelength which the crest C20 or C21 corresponds with. At least one of the waves is symmetrical about its own vertical center line.

Figure 11:
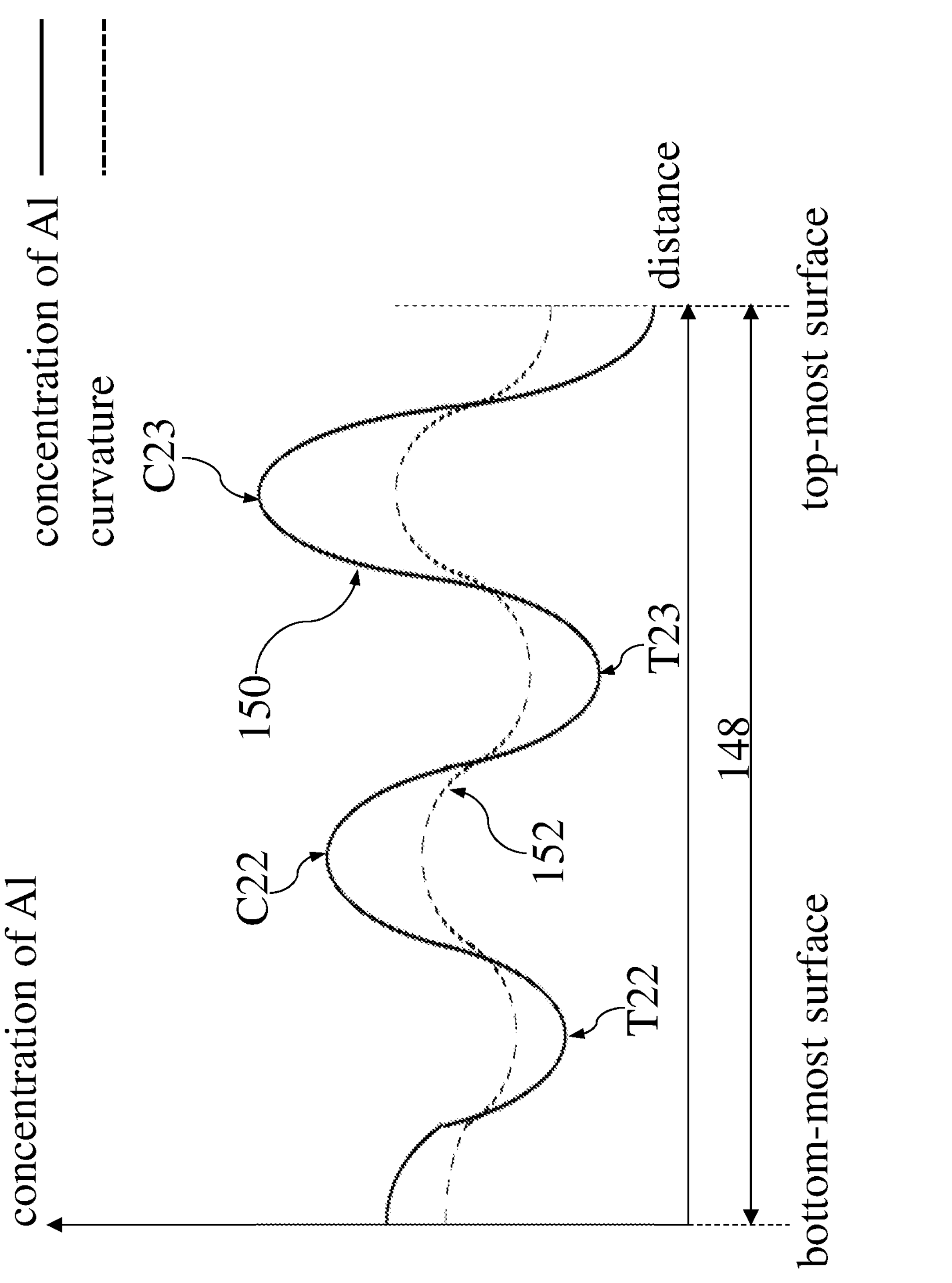
FIG. 11 is a graph showing a variable concentration of aluminum in a buffer layer versus a distance within a thickness of the same according to some embodiments of the present disclosure.

FIG. 11 is a graph showing a variable concentration of aluminum in the buffer layer 148 versus a distance within a thickness of the same according to some embodiments of the present disclosure. The buffer layer 148 can have a concentration of aluminum oscillating within the buffer layer 148, such that the concentration of aluminum varies as an oscillating function of a distance within a thickness of the buffer layer 148, as shown in a relationship curve 150 which represents an oscillating curve.

Along the cyclical oscillation, the aluminum concentration gradually oscillates. With the gradually oscillating, the resistivity of the buffer layer 148 can be modulated to get oscillating as well. The average resistivity of the buffer layer 148 can be improved as compared with an aluminum concentration directly increasing or decreasing. Such manner can avoid the trend of the curvature turned becoming too positive or too negative, as shown in a relationship curve 152 which represents a curvature trend. In some embodiments, the buffer layer 148 has a resistivity that varies as an oscillating function as well.

More specifically, the oscillating function has crests C22 and C23 in sequence and has troughs T22 and T23 in sequence. From a bottom surface to a top surface of the buffer layer 148, there are the trough T22, the crest C22, the trough T23, and the crest C23.

As the buffer layer 148 is formed to have a bottom surface in contact with a nucleation layer (e.g., the nucleation layer 12 as shown in FIG. 1), the crest C22 is closer to the bottom surface of the buffer layer 148 than the crest C23. As a nitride-based semiconductor layer is formed on the buffer layer 148 (e.g., the nitride-based semiconductor layer 20 as shown in FIG. 1), the buffer layer 148 has a top surface in contact with the nitride-based semiconductor layer, and the crest C23 is closer to the top surface of the buffer layer 148 than the crest C22.

As the buffer layer 148 is formed to have a bottom surface in contact with a nucleation layer (e.g., the nucleation layer 12 as shown in FIG. 1), the trough T22 is closer to the bottom surface of the buffer layer 148 than the trough T23. As a nitride-based semiconductor layer is formed on the buffer layer 148 (e.g., the nitride-based semiconductor layer 20 as shown in FIG. 1), the buffer layer 148 has a top surface in contact with the nitride-based semiconductor layer, and the trough T23 is closer to the top surface of the buffer layer 148 than the trough T22.

The trough T22 is high than the trough T23. The crest C22 is lower than the crest C23. Since the troughs T22 and T23 get lower along a direction and the crests C22 and C23 get higher along the direction, the oscillating function has an increasing amplitude. In some embodiments, the amplitude of the oscillating function strictly increases along a direction (e.g., an upward direction in the device).

Moreover, as the buffer layer 148 is formed to have a bottom surface in contact with a nucleation layer, the concentration of aluminum of the buffer layer 148 at the bottom surface is less than the concentration aluminum of the buffer layer 148 at the crest C22.

The horizontal distance between the crests C22 and C23 is substantially the same as the horizontal distance between the crests C23 and C12. The horizontal distance between the troughs T22 and T23 is substantially the same as the horizontal distance between the troughs T23 and T12. It results in the oscillating function having a contact wavelength.

Figure 12:
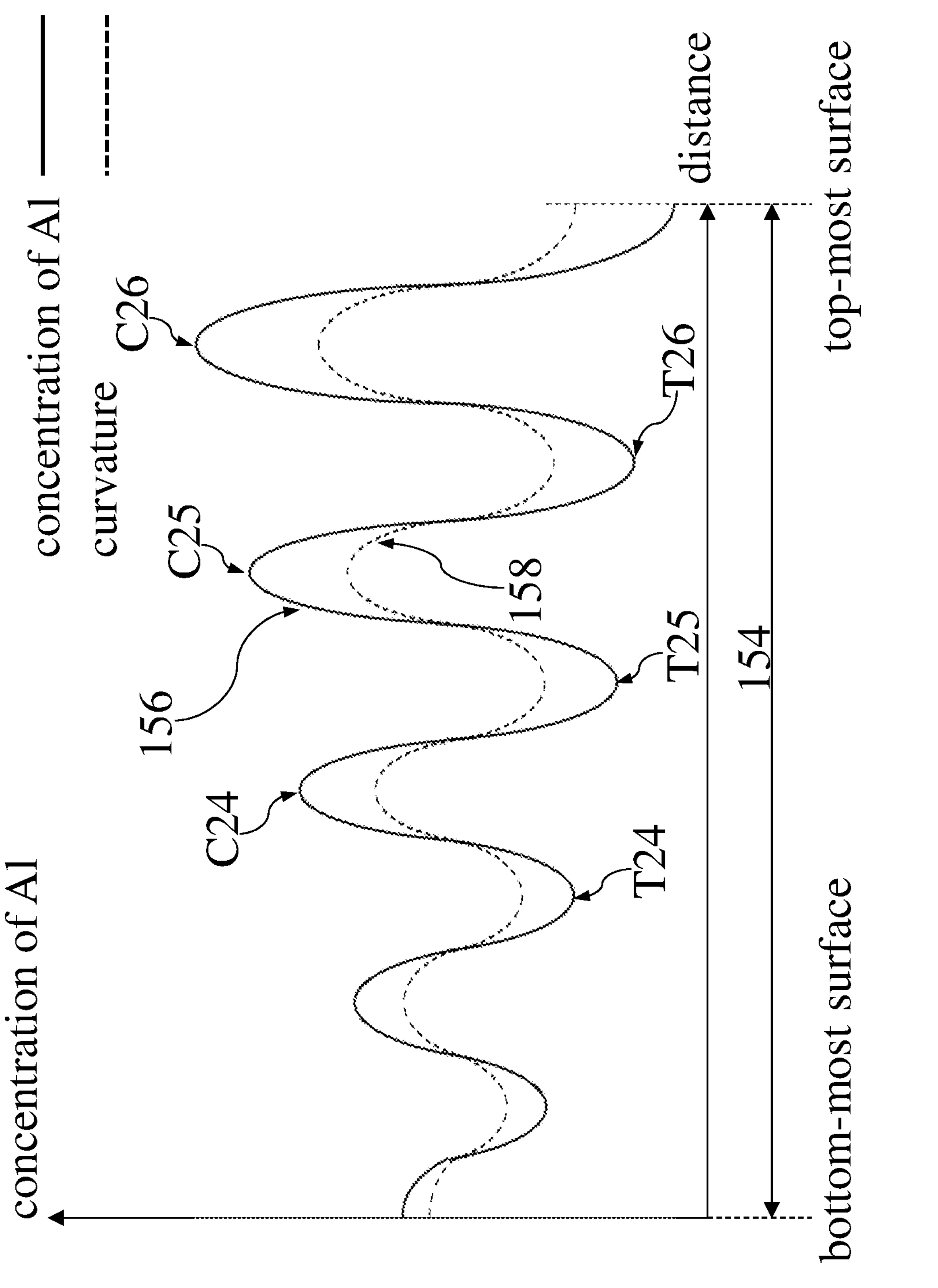
FIG. 12 is a graph showing a variable concentration of aluminum in a buffer layer versus a distance within a thickness of the same according to some embodiments of the present disclosure.

FIG. 12 is a graph showing a variable concentration of aluminum in the buffer layer 154 versus a distance within a thickness of the same according to some embodiments of the present disclosure. The buffer layer 154 can have a concentration of aluminum oscillating within the buffer layer 154, such that the concentration of aluminum varies as an oscillating function of a distance within a thickness of the buffer layer 154, as shown in a relationship curve 156 which represents an oscillating curve.

Along the cyclical oscillation, the aluminum concentration gradually oscillates. With the gradually oscillating, the resistivity of the buffer layer 154 can be modulated to get oscillating as well. The average resistivity of the buffer layer 154 can be improved as compared with an aluminum concentration directly increasing or decreasing. Such manner can avoid the trend of the curvature turned becoming too positive or too negative, as shown in a relationship curve 158 which represents a curvature trend. In some embodiments, the buffer layer 154 has a resistivity that varies as an oscillating function as well.

More specifically, the oscillating function has crests C24, C25, and C26 in sequence and has troughs T24, T25, and T26 in sequence. From a bottom surface to a top surface of the buffer layer 154, there are the trough T24, the crest C24, the trough T25, the crest C25, and the trough T26, the crest C26.

As the buffer layer 154 is formed to have a bottom surface in contact with a nucleation layer (e.g., the nucleation layer 12 as shown in FIG. 1), the crest C24 is closer to the bottom surface of the buffer layer 154 than the crest C25. The crest C25 is closer to the bottom surface of the buffer layer 154 than the crest C26. As a nitride-based semiconductor layer is formed on the buffer layer 154 (e.g., the nitride-based semiconductor layer 20 as shown in FIG. 1), the buffer layer 154 has a top surface in contact with the nitride-based semiconductor layer, and the crest C25 is closer to the top surface of the buffer layer 154 than the crest C24. The crest C26 is closer to the top surface of the buffer layer 154 than the crest C25.

As the buffer layer 154 is formed to have a bottom surface in contact with a nucleation layer (e.g., the nucleation layer 12 as shown in FIG. 1), the trough T22 is closer to the bottom surface of the buffer layer 154 than the trough T23. The trough T24 is closer to the bottom surface of the buffer layer 154 than the trough T25. As a nitride-based semiconductor layer is formed on the buffer layer 154 (e.g., the nitride-based semiconductor layer 20 as shown in FIG. 1), the buffer layer 154 has a top surface in contact with the nitride-based semiconductor layer, and the trough T23 is closer to the top surface of the buffer layer 154 than the trough T22. The trough T26 is closer to the top surface of the buffer layer 154 than the trough T25

The trough T24 is high than the trough T25. The trough T25 is high than the trough T26. The crest C24 is lower than the crest C25. The crest C25 is lower than the crest C26. Since the troughs T24, T25, and T26 get lower along a direction and the crests C24, C25, and C26 get higher along the direction, the oscillating function has an increasing amplitude. In some embodiments, the amplitude of the oscillating function strictly increases along a direction (e.g., an upward direction in the device).

Moreover, as the buffer layer 154 is formed to have a bottom surface in contact with a nucleation layer, the concentration of aluminum of the buffer layer 154 at the bottom surface is less than the concentration aluminum of the buffer layer 154 at the crest C24.

The horizontal distance between the crests C24 and C25 is substantially the same as the horizontal distance between the crests C25 and C26. The horizontal distance between the troughs T24 and T25 is substantially the same as the horizontal distance between the troughs T25 and T26. It results in the oscillating function having a contact wavelength.

In the present disclosure, the difference between FIGS. 11 and 12 can be defined as that the buffer layer 148 is formed with a lower oscillation rate of aluminum than that of the buffer layer 154. More specifically, the buffer layers 148 and 154 have different oscillation rates in the concentration of aluminum per unit thickness. In order to ease the complexity of the explanation in the present disclosure, high and low oscillation rates will be used in the following description, so as to state the oscillating concentrations as shown in FIGS. 11 and 12.

Figure 13:
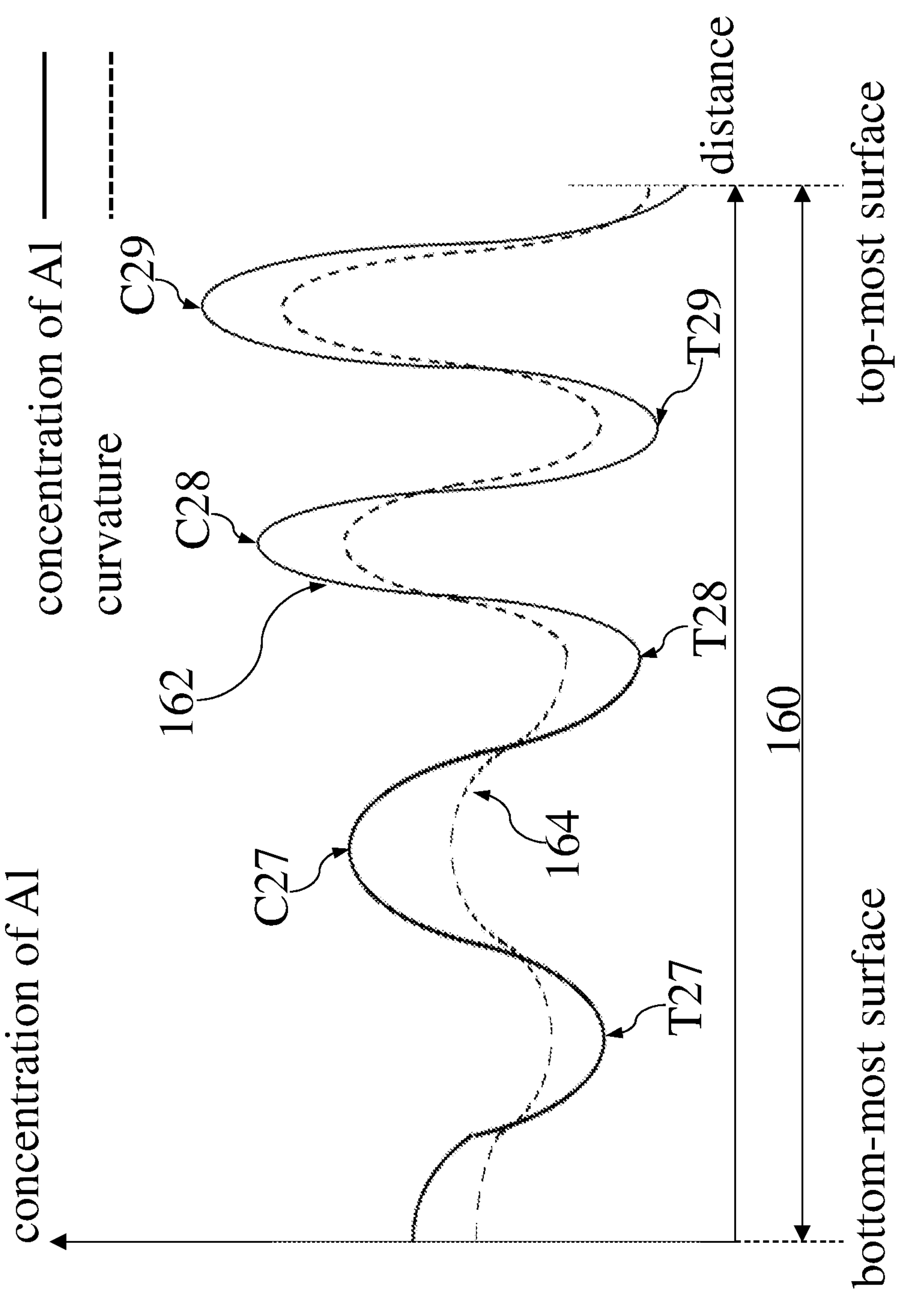
FIG. 13 is a graph showing a variable concentration of aluminum in a buffer layer versus a distance within a thickness of the same according to some embodiments of the present disclosure.

FIG. 13 is a graph showing a variable concentration of aluminum in the buffer layer 160 versus a distance within a thickness of the same according to some embodiments of the present disclosure. The buffer layer 160 can have a concentration of aluminum oscillating within the buffer layer 160, such that the concentration of aluminum varies as an oscillating function of a distance within a thickness of the buffer layer 160, as shown in a relationship curve 162 which represents an oscillating curve.

The oscillating function has a profile that is a low oscillation rate in combination with a high oscillation rate.

Along the cyclical oscillation, the aluminum concentration gradually oscillates. With the gradually oscillating, the resistivity of the buffer layer 160 can be modulated to get oscillating as well. The average resistivity of the buffer layer 160 can be improved as compared with an aluminum concentration directly increasing or decreasing. Such manner can avoid the trend of the curvature turned becoming too positive or too negative, as shown in a relationship curve 164 which represents a curvature trend. In some embodiments, the buffer layer 160 has a resistivity that varies as an oscillating function as well.

More specifically, the oscillating function has crests C27, C28 and C29 in sequence and has troughs T27, T28, and T29 in sequence. From a bottom surface to a top surface of the buffer layer 160, there are the trough T27, the crest C27, the trough T28, the crest C28, and the trough T29, the crest C29.

As the buffer layer 160 is formed to have a bottom surface in contact with a nucleation layer (e.g., the nucleation layer 12 as shown in FIG. 1), the crest C27 is closer to the bottom surface of the buffer layer 160 than the crest C28. The crest C28 is closer to the bottom surface of the buffer layer 160 than the crest C29. As a nitride-based semiconductor layer is formed on the buffer layer 160 (e.g., the nitride-based semiconductor layer 20 as shown in FIG. 1), the buffer layer 160 has a top surface in contact with the nitride-based semiconductor layer, and the crest C28 is closer to the top surface of the buffer layer 160 than the crest C27. The crest C29 is closer to the top surface of the buffer layer 160 than the crest C28.

As the buffer layer 160 is formed to have a bottom surface in contact with a nucleation layer (e.g., the nucleation layer 12 as shown in FIG. 1), the trough T22 is closer to the bottom surface of the buffer layer 160 than the trough T23. The trough T27 is closer to the bottom surface of the buffer layer 160 than the trough T28. As a nitride-based semiconductor layer is formed on the buffer layer 160 (e.g., the nitride-based semiconductor layer 20 as shown in FIG. 1), the buffer layer 160 has a top surface in contact with the nitride-based semiconductor layer, and the trough T23 is closer to the top surface of the buffer layer 160 than the trough T22. The trough T29 is closer to the top surface of the buffer layer 160 than the trough T28

The trough T27 is high than the trough T28. The trough T28 is high than the trough T29. The crest C27 is lower than the crest C28. The crest C28 is lower than the crest C29. Since the troughs T27, T28, and T29 get lower along a direction and the crests C27, C28, and C29 get higher along the direction, the oscillating function has an increasing amplitude. In some embodiments, the amplitude of the oscillating function strictly increases along a direction (e.g., an upward direction in the device).

Moreover, as the buffer layer 160 is formed to have a bottom surface in contact with a nucleation layer, the concentration of aluminum of the buffer layer 160 at the bottom surface is less than the concentration aluminum of the buffer layer 160 at the crest C27.

The horizontal distance between the crests C27 and C28 differs from the horizontal distance between the crests C28 and C29. In some embodiments, the horizontal distance between the crests C27 and C28 is greater than the horizontal distance between the crests C28 and C29. The horizontal distance between the troughs T27 and T28 differs from the horizontal distance between the troughs T28 and T29. It results in the oscillating function having a contact wavelength. In some embodiments, the horizontal distance between the troughs T27 and T28 is greater than the horizontal distance between the troughs T28 and T29. It results in the oscillating function that has a wavelength varying gradually.

It results in the oscillating function that has wavelength varying gradually. Specifically, the wave profile where the crest C27 belongs to is different than the wave profile where the crest C28 or C29 belongs to. The wavelength which the crest C27 corresponds with is different than the wavelength which the crest C28 or C29 corresponds with. At least one of the waves is symmetrical about its own vertical center line.

Figure 14:
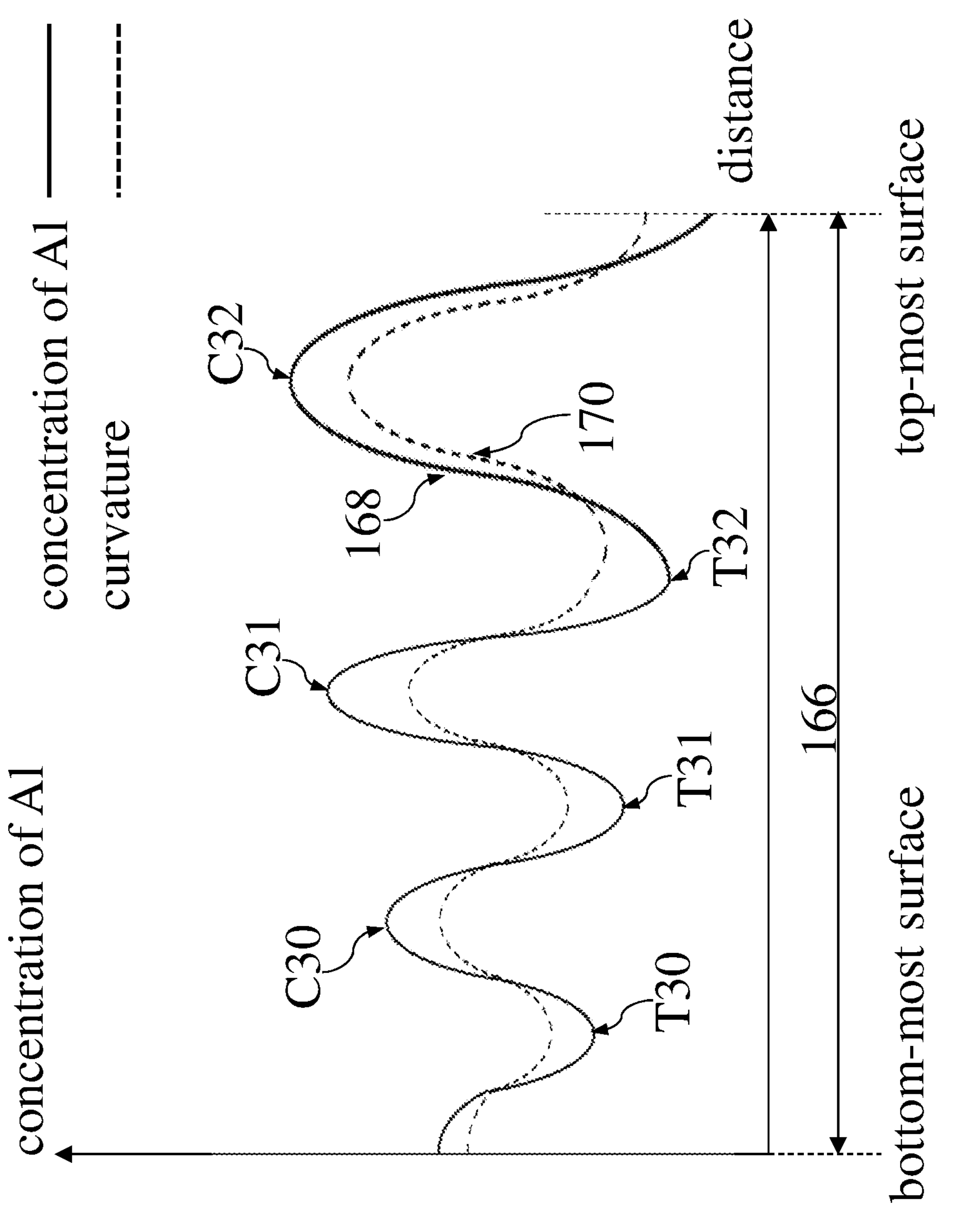
FIG. 14 is a graph showing a variable concentration of aluminum in a buffer layer versus a distance within a thickness of the same according to some embodiments of the present disclosure.

FIG. 14 is a graph showing a variable concentration of aluminum in the buffer layer 166 versus a distance within a thickness of the same according to some embodiments of the present disclosure. The buffer layer 166 can have a concentration of aluminum oscillating within the buffer layer 166, such that the concentration of aluminum varies as an oscillating function of a distance within a thickness of the buffer layer 166, as shown in a relationship curve 168 which represents an oscillating curve.

The oscillating function has a profile that is a low oscillation rate in combination with a high oscillation rate.

Along the cyclical oscillation, the aluminum concentration gradually oscillates. With the gradually oscillating, the resistivity of the buffer layer 166 can be modulated to get oscillating as well. The average resistivity of the buffer layer 166 can be improved as compared with an aluminum concentration directly increasing or decreasing. Such manner can avoid the trend of the curvature turned becoming too positive or too negative, as shown in a relationship curve 170 which represents a curvature trend. In some embodiments, the buffer layer 166 has a resistivity that varies as an oscillating function as well.

More specifically, the oscillating function has crests C30, C31 and C32 in sequence and has troughs T30, T31, and T32 in sequence. From a bottom surface to a top surface of the buffer layer 166, there are the trough T30, the crest C30, the trough T31, the crest C31, and the trough T32, the crest C32.

As the buffer layer 166 is formed to have a bottom surface in contact with a nucleation layer (e.g., the nucleation layer 12 as shown in FIG. 1), the crest C30 is closer to the bottom surface of the buffer layer 166 than the crest C31. The crest C31 is closer to the bottom surface of the buffer layer 166 than the crest C32. As a nitride-based semiconductor layer is formed on the buffer layer 166 (e.g., the nitride-based semiconductor layer 20 as shown in FIG. 1), the buffer layer 166 has a top surface in contact with the nitride-based semiconductor layer, and the crest C31 is closer to the top surface of the buffer layer 166 than the crest C30. The crest C32 is closer to the top surface of the buffer layer 166 than the crest C31.

As the buffer layer 166 is formed to have a bottom surface in contact with a nucleation layer (e.g., the nucleation layer 12 as shown in FIG. 1), the trough T22 is closer to the bottom surface of the buffer layer 166 than the trough T23. The trough T30 is closer to the bottom surface of the buffer layer 166 than the trough T31. As a nitride-based semiconductor layer is formed on the buffer layer 166 (e.g., the nitride-based semiconductor layer 20 as shown in FIG. 1), the buffer layer 166 has a top surface in contact with the nitride-based semiconductor layer, and the trough T23 is closer to the top surface of the buffer layer 166 than the trough T22. The trough T32 is closer to the top surface of the buffer layer 166 than the trough T31

The trough T30 is high than the trough T31. The trough T31 is high than the trough T32. The crest C30 is lower than the crest C31. The crest C31 is lower than the crest C32. Since the troughs T30, T31, and T32 get lower along a direction and the crests C30, C31, and C32 get higher along the direction, the oscillating function has an increasing amplitude. In some embodiments, the amplitude of the oscillating function strictly increases along a direction (e.g., an upward direction in the device).

Moreover, as the buffer layer 166 is formed to have a bottom surface in contact with a nucleation layer, the concentration of aluminum of the buffer layer 166 at the bottom surface is less than the concentration aluminum of the buffer layer 166 at the crest C30.

The horizontal distance between the crests C30 and C31 differs from the horizontal distance between the crests C31 and C32. In some embodiments, the horizontal distance between the crests C30 and C31 is less than the horizontal distance between the crests C31 and C32. It results in the oscillating function that has a wavelength varying gradually.

It results in the oscillating function that has wavelength varying gradually. Specifically, the wave profile where the crest C30 belongs to is different than the wave profile where the crest C31 or C32 belongs to. The wavelength which the crest C30 corresponds with is different than the wavelength which the crest C31 or C32 corresponds with. At least one of the waves is symmetrical about its own vertical center line.

According to the embodiments above, multiple solutions for improving the accumulation of the stress during the formation of the buffer layer are provided, which means the process for manufacturing a semiconductor device applying such concept is flexible and thus can be generally applied. The embodiments above can be applied to different situations, to make the buffer layer comply with the design. Therefore, those different solutions can be selected/chosen according to the conditions/requirements/demands of the manufacturing process.

Furthermore, the graphs involving the wave functions as stated above are illustrated for the exemplary purpose, and the present disclosure is not limited by them. Modification to them is possible and available. For example, increasing or decreasing the number of the cycles in the wave function is available. Modification to them is still in the spirit of the present disclosure.

In addition to changing the aluminum concentration as being variable, a concentration for other elements in the buffer layer may be variable as well. In this regard, since aluminum is a group III element, other group III concentration may be correspondingly fluctuated once the aluminum concentration increases or decreases. For example, due to the buffer layer including AlGaN, once the aluminum concentration increases or decreases, the concentration of gallium would increase or decrease.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:

a substrate;

a nucleation layer comprising a composition that comprises a first element and disposed on and forming an interface with the substrate;

a buffer layer comprising a III-V compound which includes the first element, the buffer layer disposed on and forming an interface with the nucleation layer, wherein the buffer layer has a concentration of the first element oscillating within the buffer layer, such that the concentration of the first element varies as an oscillating function of a distance within a thickness of the buffer layer, wherein the oscillating function has a first crest, a second crest, and a third crest in sequence, the second crest is higher than the first crest and is lower than the third crest, and a horizontal distance between the first and second crests is substantial the same as a horizontal distance between the second and third crests;

a first nitride-based semiconductor layer disposed on and forming an interface with the buffer layer;

a second nitride-based semiconductor layer disposed on the first nitride-based semiconductor layer and having a bandgap greater than a bandgap of the first nitride-based semiconductor layer, so as to form a heterojunction therebetween with a two-dimensional electron gas (2DEG) region; and two or more source/drain (S/D) electrodes and a gate electrode disposed over the second nitride-based semiconductor layer, wherein the gate electrode is between the S/D electrodes, wherein the buffer layer has a bottom surface in contact with the nucleation layer, and the first crest is closer to the bottom surface of the buffer layer than the second crest.

2. The semiconductor device of claim 1, wherein the buffer layer has a bottom surface in contact with the nucleation layer, and the second crest is closer to the bottom surface of the buffer layer than the third crest.

3. The semiconductor device of claim 1, wherein the oscillating function has amplitude increasing gradually.

4. The semiconductor device of claim 1, wherein the oscillating function has constant wavelength.

5. The semiconductor device of claim 1, wherein the oscillating function has a plurality of troughs at same elevation.

6. The semiconductor device of claim 1, wherein the first element is aluminum.

7. The semiconductor device of claim 1, wherein the oscillating function is a continuous curve.

8. The semiconductor device of claim 1, wherein the oscillating function comprises at least one sinusoid curve.

9. The semiconductor device of claim 1, wherein the oscillating function comprises a plurality of waves, and a profile of at least one of the waves is symmetrical about its own vertical center line.

10. The semiconductor device of claim 1, wherein the buffer layer has a bottom surface in contact with the nucleation layer, and the concentration of the first element of the buffer layer at the bottom surface is less than the concentration of the first element of the buffer layer at the first crest.

11. The semiconductor device of claim 1, wherein the buffer layer has a resistivity that is positive correlation with the concentration of the first element.

12. The semiconductor device of claim 1, wherein the buffer layer has a resistivity that varies as an oscillating function.

13. The semiconductor device of claim 1, wherein the buffer layer comprises AlGaN.

14. The semiconductor device of claim 1, wherein the first nitride-based semiconductor layer comprises GaN and the second nitride-based semiconductor layer comprises AlGaN.

15. A method for manufacturing a semiconductor device, comprising:

forming a nucleation layer comprising a composition that comprises a first element;

forming a buffer layer on the nucleation layer, wherein the buffer layer comprises a III-V compound which includes the first element, wherein the buffer layer has a concentration of the first element oscillating within the buffer layer, such that the concentration of the first element varies as an oscillating function of a distance within a thickness of the buffer layer, wherein the oscillating function has a first crest, a second crest, and a third crest in sequence, the second crest is higher than the first crest and is lower than the third crest, and a horizontal distance between the first and second crests is substantial the same as a horizontal distance between the second and third crests;

forming a first nitride-based semiconductor layer on the buffer layer;

forming a second nitride-based semiconductor layer on the first nitride-based semiconductor layer, wherein the second nitride-based semiconductor layer has a bandgap greater than a bandgap of the first nitride-based semiconductor layer, so as to form a heterojunction therebetween with a two-dimensional electron gas (2DEG) region; and forming two or more source/drain (S/D) electrodes and a gate electrode over the second nitride-based semiconductor layer, wherein the buffer layer is formed to have a bottom surface in contact with the nucleation layer, and the first crest is closer to the bottom surface of the buffer layer than the second crest.

16. The method of claim 15, wherein the buffer layer is formed to have a bottom surface in contact with the nucleation layer, and the second crest is closer to the bottom surface of the buffer layer than the third crest.

17. The method of claim 15, wherein the oscillating function has amplitude which increases gradually.

18. The method of claim 15, wherein the oscillating function has constant wavelength.

* * * * *